United States Patent
Fukushima et al.

(10) Patent No.: US 11,860,339 B2
(45) Date of Patent: Jan. 2, 2024

(54) OPTICALLY ANISOTROPIC LAYER

(71) Applicant: FUJIFILM Corporation, Tokyo (JP)

(72) Inventors: Yuta Fukushima, Kanagawa (JP); Shinpei Yoshida, Kanagawa (JP); Yuta Takahashi, Kanagawa (JP); Keisuke Kodama, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 18/162,359

(22) Filed: Jan. 31, 2023

(65) Prior Publication Data

US 2023/0176252 A1  Jun. 8, 2023

Related U.S. Application Data

(63) Continuation of application No. PCT/JP2021/026757, filed on Jul. 16, 2021.

(30) Foreign Application Priority Data

Aug. 4, 2020 (JP) .................... 2020-132221
Jul. 7, 2021 (JP) .................... 2021-112866

(51) Int. Cl.
*G02B 1/111* (2015.01)
*G02B 5/30* (2006.01)
*H10K 59/80* (2023.01)

(52) U.S. Cl.
CPC ............ *G02B 1/111* (2013.01); *G02B 5/3016* (2013.01); *H10K 59/8791* (2023.02)

(58) Field of Classification Search
CPC .... G02B 1/111; G02B 5/3016; G02B 5/3083; H10K 59/8791
See application file for complete search history.

(56) References Cited

U.S. PATENT DOCUMENTS

2006/0093760 A1* 5/2006 Taka ................. B41M 5/502
428/32.1
2006/0246229 A1 11/2006 Suemasu
(Continued)

FOREIGN PATENT DOCUMENTS

JP  2005-308988 A  11/2005
JP  2006-309025 A  11/2006
(Continued)

OTHER PUBLICATIONS

Office Action, issued by the Japanese Patent Office dated Sep. 5, 2023, in connection with Japanese Patent Aplication No. 2022-541414.
(Continued)

*Primary Examiner* — Mariam Qureshi
(74) *Attorney, Agent, or Firm* — Edwards Neils LLC; Jean C. Edwards, Esq.

(57) ABSTRACT

The present invention provides an optically anisotropic layer which has a plurality of regions in which alignment states of a liquid crystal compound are different in a thickness direction and in which peeling is unlikely to occur in the layer. The optically anisotropic layer of the present invention is an optically anisotropic layer formed of a liquid crystal compound, in which the optically anisotropic layer contains a leveling agent and satisfies a predetermined requirement in a profile of a secondary ion intensity derived from the leveling agent in a depth direction, which is obtained by analyzing components of the optically anisotropic layer in a depth direction by time-of-flight secondary ion mass spectrometry while irradiating the optically anisotropic layer with an ion beam from one surface of the optically anisotropic layer to the other surface of the optically anisotropic layer.

7 Claims, 7 Drawing Sheets

(56) References Cited

U.S. PATENT DOCUMENTS

2006/0255317 A1 11/2006 Suemasu
2020/0024520 A1* 1/2020 Nakajima .......... C09K 19/3497

FOREIGN PATENT DOCUMENTS

| JP | 2006-330660 | A | | 12/2006 | |
|---|---|---|---|---|---|
| JP | 2015-114503 | A | | 6/2015 | |
| JP | 2015114503 | A | * | 6/2015 | ............. C08L 33/14 |
| JP | 2017-122905 | A | | 7/2017 | |
| JP | 2018-036657 | A | | 3/2018 | |
| WO | 2018/173778 | A1 | | 9/2018 | |
| WO | 2019/035414 | A1 | | 2/2019 | |
| WO | 2020/066910 | A1 | | 4/2020 | |

OTHER PUBLICATIONS

International Search Report issued in PCT/JP2021/026757 dated Sep. 28, 2021.
Written Opinion issued in PCT/JP2021/026757 dated Sep. 28, 2021.
International Preliminary Report on Patentability completed by WIPO dated Feb. 7, 2023 in connection with International Patent Application No. PCT/JP2021/026757.

* cited by examiner

OPTICALLY ANISOTROPIC LAYER

CROSS-REFERENCE TO RELATED APPLICATIONS

This application is a Continuation of PCT International Application No. PCT/JP2021/026757 filed on Jul. 16, 2021, which was published under PCT Article 21(2) in Japanese, and which claims priority under 35 U.S.C. § 119(a) to Japanese Patent Application No. 2020-132221 filed on Aug. 4, 2020 and Japanese Patent Application No. 2021-112866 filed on Jul. 7, 2021. The above applications are hereby expressly incorporated by reference, in their entirety, into the present application.

BACKGROUND OF THE INVENTION

1. Field of the Invention

The present invention relates to an optically anisotropic layer.

2. Description of the Related Art

A retardation layer having refractive index anisotropy (optically anisotropic layer) is applied to various applications such as an antireflection film of a display device and an optical compensation film of a liquid crystal display device.

A laminated type optically anisotropic layer consisting of a plurality of layers as described in JP2018-036657A is disclosed as an optically anisotropic layer formed of a liquid crystal compound.

SUMMARY OF THE INVENTION

Conventionally, optically anisotropic layers to be laminated have been formed by coating layer by layer in a case of producing a laminated type optically anisotropic layer as described in JP2018-036657A. Therefore, it was possible to change an alignment state of a liquid crystal compound in a thickness direction in the optically anisotropic layer by changing the conditions for forming each layer.

A composition for forming an optically anisotropic layer often contains a leveling agent.

On the other hand, the present inventors have found that, in a conventionally optically anisotropic layer formed by applying the composition a plurality of times, peeling is likely to occur within the optically anisotropic layer and improvement is necessary. For example, it has been found that peeling within the optically anisotropic layer tends to occur in a case where a cross-cut test is carried out on the conventional optically anisotropic layer fixed on a substrate.

The present invention has been made in view of the above circumstances, and an object of the present invention is to provide an optically anisotropic layer which has a plurality of regions in which alignment states of a liquid crystal compound are different in a thickness direction and in which peeling is unlikely to occur in the layer.

As a result of extensive studies on the problems of the related art, the present inventors have found that the foregoing object can be achieved by the following configurations.

(1) An optically anisotropic layer formed of a liquid crystal compound,
in which the optically anisotropic layer contains a leveling agent,
in a case where components of the optically anisotropic layer in a depth direction are analyzed by time-of-flight secondary ion mass spectrometry while irradiating the optically anisotropic layer with an ion beam from one surface of the optically anisotropic layer to the other surface of the optically anisotropic layer, a profile of a secondary ion intensity derived from the leveling agent in a depth direction is obtained, a higher secondary ion intensity derived from the leveling agent, out of a secondary ion intensity derived from the leveling agent on the one surface of the optically anisotropic layer and a secondary ion intensity derived from the leveling agent on the other surface of the optically anisotropic layer, is defined as a first intensity, a secondary ion intensity which is $1/1000$ of the first intensity is defined as a second intensity, a depth position closest to the one surface showing the second intensity in the profile is defined as a first position, and a depth position closest to the other surface showing the second intensity in the profile is defined as a second position, no secondary ion intensity derived from the leveling agent of $1/500$ or more of the first intensity is observed at any depth of a region between the first position and the second position, and
the optically anisotropic layer satisfies any of the following Requirements 1 to 3.

Requirement 1: The optically anisotropic layer is an optically anisotropic layer formed by fixing a cholesteric liquid crystalline phase, and has a plurality of regions in which helical pitches of the cholesteric liquid crystalline phase are different along a thickness direction.

Requirement 2: The optically anisotropic layer is an optically anisotropic layer formed by fixing an alignment state of a liquid crystal compound, and has a plurality of regions in which tilt angles of an alignment direction of the liquid crystal compound with respect to a surface of the optically anisotropic layer are different along a thickness direction.

Requirement 3: The optically anisotropic layer has a region formed by fixing an alignment state in which the liquid crystal compound is aligned and a region formed by fixing a state in which the liquid crystal compound exhibits an isotropic phase, along a thickness direction.

(2) The optically anisotropic layer according to (1), in which the optically anisotropic layer satisfies Requirement 1.

(3) The optically anisotropic layer according to (2), in which the optically anisotropic layer has two regions in which the helical pitches of the cholesteric liquid crystalline phase are different.

(4) The optically anisotropic layer according to (1), in which the optically anisotropic layer satisfies Requirement 2.

(5) The optically anisotropic layer according to (4), in which the optically anisotropic layer has a region formed by fixing an alignment state of the liquid crystal compound homogeneously aligned and a region formed by fixing an alignment state of the liquid crystal compound homeotropically aligned.

(6) The optically anisotropic layer according to (1), in which the optically anisotropic layer satisfies Requirement 3.

(7) The optically anisotropic layer according to (6), in which the optically anisotropic layer has a region formed by fixing an alignment state of the liquid crystal compound homogeneously aligned and a region formed by fixing a state in which the liquid crystal compound exhibits an isotropic phase.

According to an aspect of the present invention, it is possible to provide an optically anisotropic layer which has a plurality of regions in which alignment states of a liquid crystal compound are different in a thickness direction and in which peeling is unlikely to occur in the layer.

DESCRIPTION OF THE PREFERRED EMBODIMENTS

Figure 1:
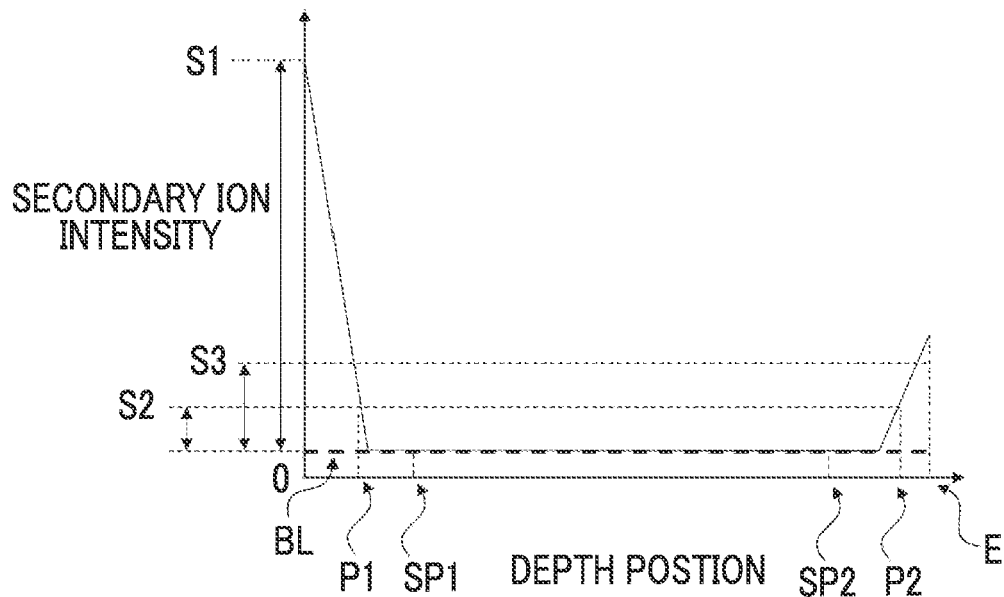
FIG. 1 is a schematic diagram for explaining a depth direction profile of a secondary ion intensity derived from a leveling agent detected by analyzing components in a depth direction of an optically anisotropic layer by time-of-flight secondary ion mass spectrometry (TOF-SIMS).

Hereinafter, the present invention will be described in more detail. Any numerical range expressed using "to" in the present specification refers to a range including the numerical values before and after the "to" as a lower limit value and an upper limit value, respectively. First, the terms used in the present specification will be described.

A slow axis is defined at 550 nm unless otherwise specified.

In the present invention, $Re(\lambda)$ and $Rth(\lambda)$ represent an in-plane retardation at a wavelength $\lambda$ and a thickness direction retardation at a wavelength $\lambda$, respectively. The wavelength $\lambda$ is 550 nm unless otherwise specified.

In the present invention, $Re(\lambda)$ and $Rth(\lambda)$ are values measured at a wavelength of $\lambda$ in AxoScan (manufactured by Axometrics, Inc.). By inputting an average refractive index $((nx+ny+nz)/3)$ and a film thickness (d ($\mu m$)) in AxoScan, slow axis direction (°)

$$Re(\lambda)=R0(\lambda)$$

$$Rth(\lambda)=((nx+ny)/2-nz)\times d$$

are calculated.

Although $R0(\lambda)$ is displayed as a numerical value calculated by AxoScan, $R0(\lambda)$ means $Re(\lambda)$.

In the present specification, the refractive indexes nx, ny, and nz are measured using an Abbe refractometer (NAR-4T, manufactured by Atago Co., Ltd.) and using a sodium lamp ($\lambda$=589 nm) as a light source. In addition, in a case of measuring the wavelength dependence, it can be measured with a multi-wavelength Abbe refractometer DR-M2 (manufactured by Atago Co., Ltd.) in combination with a dichroic filter.

In addition, the values in Polymer Handbook (John Wiley & Sons, Inc.) and catalogs of various optical films can be used. The values of the average refractive index of main optical films are illustrated below: cellulose acylate (1.48), cycloolefin polymer (1.52), polycarbonate (1.59), polymethylmethacrylate (1.49), and polystyrene (1.59).

The term "light" in the present specification means an actinic ray or radiation, for example, an emission line spectrum of a mercury lamp, a far ultraviolet ray typified by an excimer laser, an extreme ultraviolet ray (EUV light), an X-ray, an ultraviolet ray, or an electron beam (EB). Above all, an ultraviolet ray is preferable.

The term "visible light" in the present specification refers to light in a wavelength range of 380 to 780 nm. In addition, the measurement wavelength in the present specification is 550 nm unless otherwise specified.

A feature point of the optically anisotropic layer according to the embodiment of the present invention is that a leveling agent is distributed at a predetermined position in the thickness direction of the optically anisotropic layer.

As a result of studying the related art, the present inventors have found that, in the related art, a leveling agent is contained in a composition for forming an optically anisotropic layer, and in a case where such a composition is applied twice or more to form an optically anisotropic layer having a plurality of regions in which alignment states of a liquid crystal compound are different in a thickness direction, there is a region in which the leveling agent is present at a higher density inside the optically anisotropic layer. Then, it has been found that peeling is likely to occur in such a region in which the leveling agent is present at a higher density.

On the other hand, the present invention has found that the above problems can be solved by controlling the distribution of the leveling agent inside the optically anisotropic layer.

Hereinafter, the optically anisotropic layer according to the embodiment of the present invention will be described in detail.

The optically anisotropic layer according to the embodiment of the present invention is a layer formed of a liquid crystal compound.

More specifically, the optically anisotropic layer according to the embodiment of the present invention is an optically anisotropic layer satisfying the Requirements 1 to 3 which will be described later, the details of which will be described later.

As will be described later, the optically anisotropic layer according to the embodiment of the present invention may contain a region exhibiting no optical anisotropy in a thickness direction.

The optically anisotropic layer according to the embodiment of the present invention contains a leveling agent.

The leveling agent is not particularly limited, and is preferably a fluorine-based leveling agent or a silicon-based leveling agent and more preferably a fluorine-based leveling agent from the viewpoint that the distribution of the leveling agent which will be described later is easily formed.

The fluorine-based leveling agent is a leveling agent having a fluorine atom, which preferably has a fluoroaliphatic group.

The fluorine-based leveling agent preferably has a repeating unit represented by Formula (1).

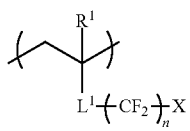
(1)

In Formula (1), $R^1$ represents a hydrogen atom, a halogen atom, or a methyl group.

$L^1$ represents a single bond or a divalent linking group. The divalent linking group is not particularly limited, and examples thereof include a divalent hydrocarbon group (for example, a divalent aliphatic hydrocarbon group such as an alkylene group having 1 to 10 carbon atoms, an alkenylene group having 1 to 10 carbon atoms, or an alkynylene group having 1 to 10 carbon atoms; or a divalent aromatic hydrocarbon group such as an arylene group), a divalent heterocyclic group, —O—, —S—, —NH—, —CO—, and a group formed by a combination thereof (for example, —CO—O—, —O-divalent hydrocarbon group-, —(O-divalent hydrocarbon group)$_m$-O— (where m represents an integer of 1 or more), or a —O—CO-divalent hydrocarbon group).

n represents an integer of 1 to 18, preferably an integer of 4 to 12, and more preferably an integer of 6 to 8.

X is a hydrogen atom or a fluorine atom.

The repeating unit represented by Formula (1) is preferably a repeating unit represented by Formula (2) from the viewpoint that the distribution of the leveling agent which will be described later is easily formed.

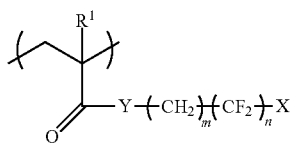
(2)

In Formula (2), the definitions of $R^1$, n, and X are the same as the definitions of each group in Formula (1) above.

Y represents an oxygen atom, a sulfur atom, or —N($R^2$)—. $R^2$ represents a hydrogen atom or an alkyl group having 1 to 8 carbon atoms which may have a substituent.

m represents an integer of 1 to 6 and preferably an integer of 1 to 3.

The fluorine-based leveling agent may have only one type of repeating unit represented by Formula (1), or may have two or more types of repeating units represented by Formula (1).

The content of the repeating unit represented by Formula (1) in the fluorine-based leveling agent is not particularly limited, and is preferably 20% to 100% by mass and more preferably 30% to 95% by mass with respect to all the repeating units of the fluorine-based leveling agent, from the viewpoint that the distribution of the leveling agent which will be described later is easily formed.

In a case where the fluorine-based leveling agent has two or more types of repeating units represented by Formula (1), the total content thereof is preferably within the above range.

The fluorine-based leveling agent may have a repeating unit other than the repeating unit represented by Formula (1).

The other repeating unit may have, for example, a repeating unit having a hydrophilic group (for example, a poly(oxyalkylene) group or a hydroxy group).

The fluorine-based leveling agent may have a repeating unit represented by Formula (3).

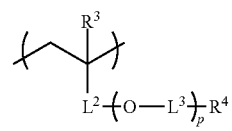
(3)

$R^3$ represents a hydrogen atom, a halogen atom, or a methyl group.

$L^2$ represents a single bond or a divalent linking group. The definition of the divalent linking group is as described above.

$L^3$ represents an alkylene group. The alkylene group preferably has 2 to 3 carbon atoms.

p represents an integer of 4 to 20 and preferably an integer of 5 to 15.

$R^4$ represents a hydrogen atom or a substituent. Examples of the substituent include an alkyl group, an alkoxy group, a halogen atom, an aryl group, a cyano group, a hydroxy group, an amino group, and a group formed by a combination thereof (for example, -alkylene group-OH).

The fluorine-based leveling agent may have only one type of repeating unit represented by Formula (3), or may have two or more types of repeating units represented by Formula (3).

The content of the repeating unit represented by Formula (3) in the fluorine-based leveling agent is not particularly limited, and is preferably 2% to 70% by mass and more preferably 5% to 60% by mass with respect to all the repeating units of the fluorine-based leveling agent, from the viewpoint that the distribution of the leveling agent which will be described later is easily formed.

In a case where the fluorine-based leveling agent has two or more types of repeating units represented by Formula (3), the total content thereof is preferably within the above range.

The weight-average molecular weight of the fluorine-based leveling agent is not particularly limited, and is preferably 3,000 to 30,000 and more preferably 5,000 to 25,000, from the viewpoint that the distribution of the leveling agent which will be described later is easily formed.

The silicon-based leveling agent is preferably a leveling agent containing a plurality of dialkylsilyloxy units as repeating units.

The content of the leveling agent in the optically anisotropic layer is not particularly limited, and is preferably 0.010% to 5.000% by mass and more preferably 0.020% to 2.000% by mass with respect to the total mass of the optically anisotropic layer, from the viewpoint that an optically anisotropic layer in which peeling is less likely to occur in the optically anisotropic layer can be obtained (hereinafter, also simply referred to as "the viewpoint that the effect of the present invention is more excellent").

The optically anisotropic layer may contain materials other than the above-mentioned materials.

Examples of other materials include other components that may be contained in a composition for forming an optically anisotropic layer, which will be described later. Details of other components will be described later.

In a case where components of the optically anisotropic layer in a depth direction are analyzed by time-of-flight secondary ion mass spectrometry while irradiating the optically anisotropic layer with an ion beam from one surface of the optically anisotropic layer to the other surface of the optically anisotropic layer, a profile of a secondary ion intensity derived from the leveling agent in a depth direction is obtained, a higher secondary ion intensity derived from the leveling agent, out of a secondary ion intensity derived from the leveling agent on one surface of the optically anisotropic layer and a secondary ion intensity derived from the leveling agent on the other surface of the optically anisotropic layer, is defined as a first intensity, the secondary ion intensity which is 1/1000 of the first intensity is defined as a second intensity, a depth position closest to the one surface showing the second intensity in the profile is defined as a first position, and a depth position closest to the other surface showing the second intensity in the profile is defined as a second position, no secondary ion intensity derived from the leveling agent of 1/500 or more of the first intensity is observed at any depth of a region between the first position and the second position.

Hereinafter, the foregoing requirements will be described in detail with reference to the accompanying drawings. In the drawings shown below, the scale and the like are described in a form different from the actual data for the sake of making it easier to understand the content of the invention.

FIG. 1 shows an example of a profile obtained by analyzing the components in each layer in a depth direction by TOF-SIMS while ion-sputtering from one surface of the optically anisotropic layer to the other surface of the optically anisotropic layer. In the present specification, the depth direction is intended to mean a direction toward the other surface of the optically anisotropic layer with reference to one surface of the optically anisotropic layer.

In the profile in a depth direction shown in FIG. 1, a lateral axis (an axis extending in a left-right direction of a paper surface in FIG. 1) represents a depth with reference to one surface of the optically anisotropic layer, and a vertical axis (an axis extending in a vertical direction of a paper surface in FIG. 1) represents a secondary ion intensity derived from a leveling agent.

The TOF-SIMS is specifically described in "Surface Analysis Technology Library Secondary Ion Mass Spectrometry" edited by the Surface Science Society of Japan and published by Maruzen Co., Ltd. (1999).

Figure 2:
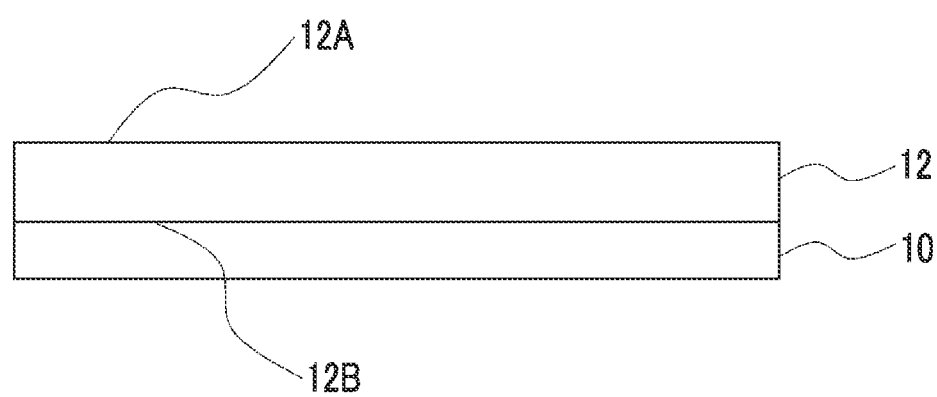
FIG. 2 is a schematic diagram showing an example of the optically anisotropic layer of FIG. 1.

The profile in FIG. 1 corresponds to the result of analyzing the components in each layer in a depth direction by TOF-SIMS while ion-sputtering from one surface 12A of an optically anisotropic layer 12 disposed on a substrate 10 (the surface of the optically anisotropic layer 12 opposite to the substrate 10) to the other surface 12B of the optically anisotropic layer 12 (the surface of the optically anisotropic layer 12 on the substrate 10 side), shown in FIG. 2.

The optically anisotropic layer 12 shown in FIG. 2 corresponds to an example of an aspect in which a composition for forming an optically anisotropic layer containing predetermined components (a liquid crystal compound and a leveling agent) is applied onto the substrate 10 to form an optically anisotropic layer.

The position where the lateral axis is zero in FIG. 1 corresponds to the surface 12A of the optically anisotropic layer 12, and the position where the lateral axis is E corresponds to the other surface 12B of the optically anisotropic layer 12. That is, zero to E on the lateral axis correspond to from one surface to the other surface of the optically anisotropic layer 12.

In a case of analyzing the components of the optically anisotropic layer in a depth direction by TOF-SIMS while irradiating the optically anisotropic layer with an ion beam, the series of operations are repeated including carrying out the component analysis in a surface depth region of 1 to 2 nm, then digging further in a depth direction from 1 nm to several hundred nm, and carrying out the component analysis in the next surface depth region of 1 to 2 nm.

The result of the secondary ion intensity derived from the leveling agent is shown in the profile in a depth direction shown in FIG. 1.

In the present specification, the "secondary ion intensity derived from the leveling agent" determined by the profile in a depth direction detected by analyzing the components of the optically anisotropic layer in a depth direction by TOF-SIMS is intended to mean an intensity of fragment ions derived from the leveling agent.

As shown in FIG. 1, in a case where the components of the optically anisotropic layer in a depth direction are analyzed by TOF-SIMS while irradiating the optically anisotropic layer with an ion beam from one surface of the optically anisotropic layer to the other surface of the optically anisotropic layer, first, the secondary ion intensity derived from the leveling agent is observed to be high, and in a case where the optically anisotropic layer is further irradiated with an ion beam in a depth direction, the intensity gradually decreases. Further, the secondary ion intensity derived from the leveling agent remains low toward the other surface side, and the intensity begins to increase as it approaches the other surface side.

Since the leveling agent tends to be present at a higher density on an air interface side and a substrate interface side (particularly, an air interface side), the secondary ion intensity derived from the leveling agent tends to appear high in the vicinity of one surface and in the vicinity of the other surface as described above.

Next, a baseline is drawn in the profile obtained above to determine the standard for secondary ion intensity. Specifically, as shown in FIG. 1, a baseline BL indicated by a thick broken line is drawn, and this position is defined as a point where the secondary ion intensity is zero.

As a method of drawing the baseline, in a case where, first, a depth position corresponding to $1/10$ of the thickness of the entire optically anisotropic layer from one surface of the optically anisotropic layer to the other surface of the optically anisotropic layer is defined as a reference position SP1, and a depth position corresponding to $9/10$ of the thickness of the entire optically anisotropic layer is defined as a reference position SP2, an average value of the secondary ion intensity derived from the leveling agent located between the reference position SP1 and the reference position SP2 is obtained and then the baseline is drawn with the average value. That is, an average value of the secondary ion intensity derived from the leveling agent in the region between the reference position SP1 and the reference position SP2 is calculated, a straight line indicating the average value is drawn along the lateral axis, and then this straight line is taken as the baseline.

Next, in the profile obtained above, a higher secondary ion intensity derived from the leveling agent, out of a secondary ion intensity derived from the leveling agent on one surface of the optically anisotropic layer and a secondary ion intensity derived from the leveling agent on the other surface of the optically anisotropic layer, is defined as the first intensity. In FIG. 1, since the secondary ion intensity (secondary ion intensity derived from the leveling agent whose depth position is zero in FIG. 1) derived from the leveling agent on one surface corresponding to the surface of the optically anisotropic layer opposite to the substrate is higher than the secondary ion intensity (secondary ion intensity derived from the leveling agent whose depth position is E in FIG. 1) derived from the leveling agent on the other surface corresponding to the surface of the optically anisotropic layer on the substrate side, the secondary ion intensity derived from the leveling agent on one surface corresponding to the surface of the optically anisotropic layer opposite to the substrate is defined as the first intensity S1.

As shown in FIG. 1, the first intensity S1 means an intensity with reference to the above-mentioned baseline BL. That is, the first intensity S1 is calculated with the position of the baseline BL as the secondary ion intensity of zero.

Next, the secondary ion intensity which is $1/1000$ of the first intensity S1 is defined as the second intensity S2.

As the secondary ion intensity derived from the leveling agent on one surface of the optically anisotropic layer, the maximum value of the secondary ion intensity derived from the leveling agent in the region between one surface and 10 nm along a depth direction is adopted.

In addition, as the secondary ion intensity derived from the leveling agent on the other surface of the optically anisotropic layer, the maximum value of the secondary ion intensity derived from the leveling agent in the region between the other surface and 10 nm from the other surface toward one surface is adopted.

Next, in the profile shown in FIG. 1, the depth position closest to the one substrate side showing the second intensity S2 is defined as the first position P1, and the depth position closest to the other substrate side showing the second intensity S2 is defined as the second position P2.

Next, the secondary ion intensity derived from the leveling agent is observed at the depth position of the region between the first position P1 and the second position P2. In the optically anisotropic layer according to the embodiment of the present invention, no secondary ion intensity derived from the leveling agent of $1/500$ or more of the first intensity S1 is observed at any depth in the region between the first position P1 and the second position P2. More specifically, in FIG. 1, an intensity that is $1/500$ of the first intensity S1 is shown as a third intensity S3, and it is observed that the secondary ion intensity derived from the leveling agent at any depth position in the region between the first position P1 and the second position P2 is not equal to or higher than the third intensity S3.

Peeling inside the optically anisotropic layer is suppressed by satisfying the foregoing requirements.

In a case where the secondary ion intensity derived from the leveling agent at any depth position in the region between the first position P1 and the second position P2 is equal to or higher than the third intensity S3, peeling is likely to occur in the vicinity of the depth position where the secondary ion intensity is equal to or higher than the third intensity S3, and the effect of the present invention cannot be obtained.

The distribution state of the leveling agent as described above can be achieved, for example, by a procedure of a method for producing an optically anisotropic layer that satisfies any of Requirements 1 to 3, which will be described later. In the production method which will be described later, an optically anisotropic layer having a plurality of regions in which the alignment states of the liquid crystal compound are different in a thickness direction can be realized by applying the composition once. Therefore, in the composition layer formed by applying the composition in such a procedure, the leveling agent tends to be present at a higher density on the air interface side or the substrate side on which the composition is applied. As a result, in the optically anisotropic layer, the above-mentioned distribution state of the leveling agent can be achieved and a plurality of regions in which the alignment states of the liquid crystal compound are different can be formed in a thickness direction.

The optically anisotropic layer according to the embodiment of the present invention satisfies any of the following Requirements 1 to 3.

Requirement 1: The optically anisotropic layer is an optically anisotropic layer formed by fixing a cholesteric liquid crystalline phase, and has a plurality of regions in which helical pitches of the cholesteric liquid crystalline phase are different along a thickness direction.

Requirement 2: The optically anisotropic layer is an optically anisotropic layer formed by fixing an alignment state of a liquid crystal compound, and has a plurality of regions in which tilt angles of an alignment direction of the liquid crystal compound with respect to a surface of the optically anisotropic layer are different along a thickness direction.

Requirement 3: The optically anisotropic layer has a region formed by fixing an alignment state in which the liquid crystal compound is aligned and a region formed by fixing a state in which the liquid crystal compound exhibits an isotropic phase, along a thickness direction.

Hereinafter, each of the requirements will be described in detail.

<<Requirement 1>>

The optically anisotropic layer that satisfies Requirement 1 is an optically anisotropic layer formed by fixing a cholesteric liquid crystalline phase, and has a plurality of regions in which helical pitches of the cholesteric liquid crystalline phase are different along a thickness direction.

Figure 3:
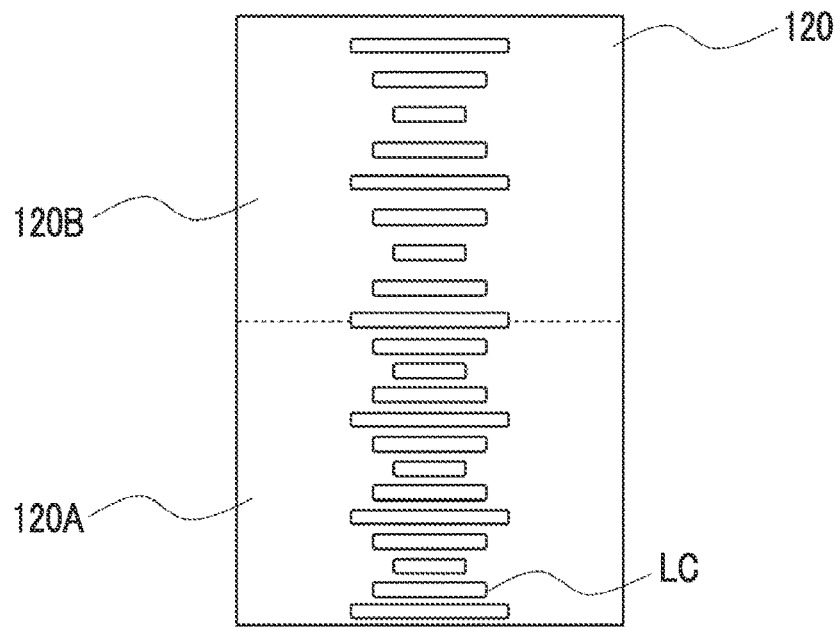
FIG. 3 is a cross-sectional view showing one embodiment of an optically anisotropic layer that satisfies Requirement 1.

FIG. 3 shows an embodiment of an optically anisotropic layer that satisfies Requirement 1.

An optically anisotropic layer 120 shown in FIG. 3 is an optically anisotropic layer formed by fixing a cholesteric liquid crystalline phase formed of a liquid crystal compound LC, and has a first region 120A and a second region 120B along a thickness direction. The helical pitches of the cholesteric liquid crystalline phase are different between the first region 120A and the second region 120B, and the helical pitch of the second region 120B is larger than that of the first region 120A. Therefore, the selective reflection center wavelength derived from the cholesteric liquid crystalline phase in the first region 120A and the selective reflection center wavelength derived from the cholesteric liquid crystalline phase in the second region 120B are different from each other. For example, the optically anisotropic layer may be an optically anisotropic layer having a region in which a cholesteric liquid crystalline phase that reflects blue light is fixed and a region in which a cholesteric liquid crystalline phase that reflects green light is fixed, along a thickness direction, or may be an optically anisotropic layer having a region in which a cholesteric liquid crystalline phase that reflects green light is fixed and a region in which a cholesteric liquid crystalline phase that reflects red light is fixed, along a thickness direction.

The optically anisotropic layer preferably has at least two selected from the group consisting of the region in which a cholesteric liquid crystalline phase that reflects blue light is fixed, the region in which a cholesteric liquid crystalline phase that reflects green light is fixed, and the region in which a cholesteric liquid crystalline phase that reflects red light is fixed.

In the present specification, the selective reflection center wavelength refers to an average value of two wavelengths showing a half-value transmittance: $T_{1/2}$(%) expressed by the following expression, in a case where a minimum value of the transmittance in a target object (member) is defined as $T_{min}$(%).

$T_{1/2} = 100 - (100 - T_{min})/2$     Expression for calculating half-value transmittance:

In addition, among the visible light, light in a wavelength range of 420 nm or longer and shorter than 500 nm is blue light (B light), light in a wavelength range of 500 nm or longer and shorter than 600 nm is green light (G light), and light in a wavelength range of 600 nm or longer and shorter than 700 nm is red light (R light).

In the present specification, the "fixed" state is the most typical and preferable aspect of a state in which the alignment of the liquid crystal compound is maintained. The "fixed" state is not limited thereto and is specifically more preferably a state in which, in a temperature range of usually 0° C. to 50° C. or in a temperature range of −30° C. to 70° C. under more severe conditions, the layer has no fluidity and a fixed alignment morphology can be maintained stably without causing a change in the alignment morphology due to an external field or an external force.

In the optically anisotropic layer, it is no longer necessary for the composition in the layer to finally exhibit liquid crystallinity.

In addition, in the aspect shown in FIG. 3, the optically anisotropic layer 120 has two regions in which the helical pitches of the cholesteric liquid crystalline phase are different (in other words, two regions in which the alignment states of the liquid crystal compound are different), but the present invention is not limited to the above aspect, and the optically anisotropic layer may have three or more regions in which the helical pitches of the cholesteric liquid crystalline phase are different.

The first region 120A and the second region 120B included in the optically anisotropic layer 120 exhibit selective reflection of circularly polarized light that selectively reflects either one sense circularly polarized light of dextrorotatory circularly polarized light or levorotatory circularly polarized light, and transmits the other sense circularly polarized light.

The selective reflection center wavelength λ (selective reflection center wavelength) of the cholesteric liquid crystalline phase depends on a helical pitch P (=helical period) in the cholesteric liquid crystalline phase, and follows a relationship of λ=n×P between an average refractive index n of the cholesteric liquid crystalline phase and λ. As can be seen from this expression, the selective reflection center wavelength can be adjusted to a predetermined range by adjusting the n value and the P value.

In the present specification, the term "sense" may be used for the twisted direction of the helix of the cholesteric liquid crystalline phase. It allows to reflect dextrorotatory circularly polarized light and transmit levorotatory circularly polarized light in a case where the twisted direction (sense) of the helix of the cholesteric liquid crystalline phase is right-handed, whereas it allows to reflect levorotatory circularly polarized light and transmit dextrorotatory circularly polarized light in a case where the sense is left-handed.

In the optically anisotropic layer, it is preferable that the senses in the regions where the helical pitches of the cholesteric liquid crystalline phase are different are the same.

Since the helical pitch of the cholesteric liquid crystalline phase depends on the type of the chiral agent to be used together with the liquid crystal compound or the addition concentration thereof, a desired helical pitch can be obtained by adjusting these factors. As for the method for measuring helical sense and pitch, the methods described in "Easy Steps in Liquid Crystal Chemistry Experiment" p. 46, edited by The Japanese Liquid Crystal Society, published by Sigma Publishing Company, 2007, and "Liquid Crystal Handbook" p. 196, Editorial Committee of Liquid Crystal Handbook, published by Maruzen Co., Ltd. can be used.

The thickness of the optically anisotropic layer that satisfies Requirement 1 is not particularly limited and is preferably 0.05 to 10 μm, more preferably 0.1 to 8.0 μm, and still more preferably 0.2 to 6.0 μm.

The method for producing the optically anisotropic layer that satisfies Requirement 1 is not particularly limited, and is preferably a production method having the following steps 1A to 5A.

Step 1A: a step of forming a composition layer containing a chiral agent containing at least a photosensitive chiral agent whose helical twisting power changes upon irradiation with light, a liquid crystal compound having a polymerizable group, and a leveling agent Step 2A: a step of subjecting the composition layer to a heat treatment to align the liquid crystal compound in the composition layer to form a cholesteric liquid crystalline phase Step 3A: a step of irradiating the composition layer with light for 50 seconds or less and at an irradiation amount of 300 mJ/cm$^2$ or less under the condition that the oxygen concentration is 1% by volume or more, after the step 2A Step 4A: a step of subjecting the composition layer to a heat treatment at a temperature higher than that upon irradiation with light, after the step 3A Step 5A: a step of subjecting the composition layer to a curing treatment to form an optically anisotropic layer having a plurality of regions in which the alignment states of the liquid crystal compound are different along a thickness direction, after the step 4A As will be described later, in order to produce the optically anisotropic layer satisfying Requirement 1, the total content of the chiral agent (total content of all the chiral agents) in the composition layer is preferably more than 5.0% by mass with respect to the total mass of the liquid crystal compound.

Hereinafter, the procedure of each of the above-mentioned steps will be described in detail.

<Step 1A>

The step 1A is a step of forming a composition layer containing a chiral agent containing at least a photosensitive chiral agent whose helical twisting power changes upon irradiation with light, a liquid crystal compound having a polymerizable group, and a leveling agent. Carrying out this step leads to the formation of a composition layer to be subjected to a light irradiation treatment which will be described later.

In the following, first, the materials used in this step will be described in detail, and then the procedure of the step will be described in detail.

(Chiral Agent)

The composition layer of the step 1A contains a chiral agent containing at least a photosensitive chiral agent whose helical twisting power changes upon irradiation with light. First, the photosensitive chiral agent whose helical twisting power changes upon irradiation with light will be described in detail.

The helical twisting power (HTP) of the chiral agent is a factor indicating a helical alignment ability expressed by Expression (A).

HTP=1/(length(unit: μm) of helical pitch×concentration(% by mass) of chiral agent with respect to liquid crystal compound) [μm$^{-1}$]　　Expression (A)

The length of the helical pitch refers to a length of pitch P (=the period of the helix) of a helical structure of the cholesteric liquid crystalline phase and can be measured by the method described in Liquid Crystal Handbook (published by Maruzen Co., Ltd.), p. 196.

The photosensitive chiral agent whose helical twisting power changes upon irradiation with light (hereinafter, also simply referred to as "chiral agent A") may be liquid crystalline or non-liquid crystalline. The chiral agent A generally contains an asymmetric carbon atom in many cases. The chiral agent A may be an axial asymmetric compound or planar asymmetric compound that does not contain an asymmetric carbon atom.

The chiral agent A may be a chiral agent whose helical twisting power increases upon irradiation with light, or may be a chiral agent whose helical twisting power decreases upon irradiation with light. Above all, a chiral agent whose helical twisting power decreases upon irradiation with light is preferable.

The "increase and decrease in helical twisting power" in the present specification represents an increase or a decrease in helical twisting power in a case where an initial helical direction (helical direction before irradiation with light) of the chiral agent A is defined as "positive". Accordingly, even in a case where the helical twisting power of a chiral agent continues to decrease and goes below zero upon irradiation with light and therefore the helical direction is "negative" (that is, even in a case where a chiral agent induces a helix in a helical direction opposite to an initial helical direction (helical direction before light irradiation)), such a chiral agent also corresponds to the "chiral agent whose helical twisting power decreases".

The chiral agent A may be, for example, a so-called photoreactive chiral agent. The photoreactive chiral agent is a compound which has a chiral site and a photoreactive site that undergoes a structural change upon irradiation with light and which greatly changes a twisting power of a liquid crystal compound according to an irradiation amount, for example.

Examples of the photoreactive site that undergoes a structural change upon irradiation with light include photochromic compounds (Kingo Uchida and Masahiro Irie, "Chemical Industry", Vol. 64, p. 640, 1999; and Kingo Uchida and Masahiro Irie, "Fine Chemicals", Vol. 28(9), p. 15, 1999). In addition, the structural change means decomposition, addition reaction, isomerization, racemization, [2+2] photocyclization, dimerization reaction, or the like occurred upon irradiation of a photoreactive site with light, and the structural change may be irreversible. In addition, the chiral site corresponds to the asymmetric carbon described in Chemistry of Liquid Crystals, No. 22, Hiroyuki Nohira, Chemical Reviews, p. 73, 1994.

Examples of the chiral agent A include photoreactive chiral agents described in paragraphs [0044] to [0047] of JP2001-159709A, optically active compounds described in paragraphs [0019] to [0043] of JP2002-179669A, optically active compounds described in paragraphs [0020] to [0044] of JP2002-179633A, optically active compounds described in paragraphs [0016] to [0040] of JP2002-179670A, optically active compounds described in paragraphs [0017] to [0050] of JP2002-179668A, optically active compounds described in paragraphs [0018] to [0044] of JP2002-180051A, optically active isosorbide derivatives described in paragraphs [0016] to [0055] of JP2002-338575A, photoreactive optically active compounds described in paragraphs [0023] to [0032] of JP2002-080478A, photoreactive chiral agents described in paragraphs [0019] to [0029] of JP2002-080851A, optically active compounds described in paragraphs [0022] to [0049] of JP2002-179681A, optically active compounds described in paragraphs [0015] to [0044] of JP2002-302487A, optically active polyesters described in paragraphs [0015] to [0050] of JP2002-338668A, binaphthol derivatives described in paragraphs [0019] to [0041] of JP2003-055315A, optically active fulgide compounds described in paragraphs [0008] to [0043] of JP2003-073381A, optically active isosorbide derivatives described in paragraphs [0015] to [0057] of JP2003-306490A, optically active isosorbide derivatives described in paragraphs [0015] to [0041] of JP2003-306491A, optically active isosorbide derivatives described in paragraphs [0015] to [0049] of JP2003-313187A, optically active isomannide derivatives described in paragraphs [0015] to [0057] of JP2003-313188A, optically active isosorbide derivatives described in paragraphs [0015] to [0049] of JP2003-313189A, optically active polyesters/amides described in paragraphs [0015] to [0052] of JP2003-313292A, optically active compounds described in paragraphs [0012] to [0053] of WO2018/194157A, and optically active compounds described in paragraphs [0020] to [0049] of JP2002-179682A.

Above all, the chiral agent A is preferably a compound having at least a photoisomerization site, and the photoisomerization site more preferably has a photoisomerizable double bond. The photoisomerization site having a photoisomerizable double bond is preferably a cinnamoyl site, a chalcone site, an azobenzene site, or a stilbene site from the viewpoint that photoisomerization is likely to occur and the difference in helical twisting power before and after light irradiation is large; and more preferably a cinnamoyl site, a chalcone site, or a stilbene site from the viewpoint that the absorption of visible light is small. In addition, the photoisomerization site corresponds to the above-mentioned photoreactive site that undergoes a structural change upon irradiation with light.

In addition, the chiral agent A preferably has a trans photoisomerizable double bond from the viewpoint that the initial helical twisting power (helical twisting power before light irradiation) is high and the amount of change in the helical twisting power upon irradiation with light is more excellent.

In addition, the chiral agent A preferably has a cis photoisomerizable double bond from the viewpoint that the initial helical twisting power (helical twisting power before light irradiation) is low and the amount of change in the helical twisting power upon irradiation with light is more excellent.

The chiral agent A preferably has any partial structure selected from a binaphthyl partial structure, an isosorbide partial structure (a partial structure derived from isosorbide), and an isomannide partial structure (a partial structure derived from isomannide). The binaphthyl partial structure, the isosorbide partial structure, and the isomannide partial structure are intended to have the following structures, respectively.

The portion of the binaphthyl partial structure in which the solid line and the broken line are parallel to each other represents a single bond or a double bond. In the structures shown below, * represents a bonding position.

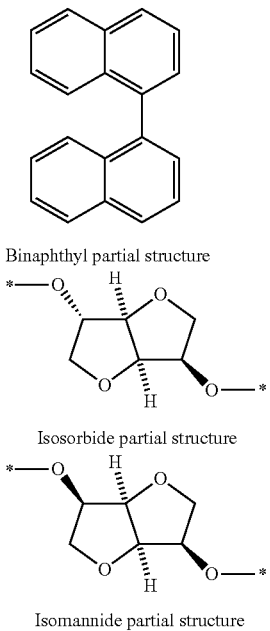

Binaphthyl partial structure

Isosorbide partial structure

Isomannide partial structure

The chiral agent A may have a polymerizable group. The type of the polymerizable group is not particularly limited, and is preferably a functional group capable of an addition polymerization reaction, more preferably a polymerizable ethylenic unsaturated group or a ring-polymerizable group, and still more preferably a (meth)acryloyl group, a vinyl group, a styryl group, or an allyl group.

The chiral agent A is preferably a compound represented by Formula (C).

R-L-R                                    Formula (C)

R's each independently represent a group having at least one site selected from the group consisting of a cinnamoyl site, a chalcone site, an azobenzene site, and a stilbene site.

L represents a divalent linking group formed by removing two hydrogen atoms from a structure represented by Formula (D) (a divalent linking group formed by removing two hydrogen atoms from the binaphthyl partial structure), a divalent linking group represented by Formula (E) (a divalent linking group consisting of the isosorbide partial structure), or a divalent linking group represented by Formula (F) (a divalent linking group consisting of the isomannide partial structure).

In Formula (E) and Formula (F), * represents a bonding position.

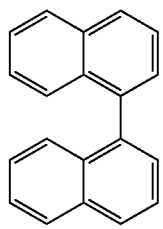

Formula (D)

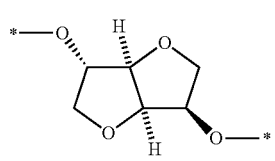

Formula (E)

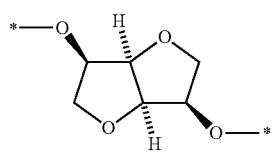

Formula (F)

At least the above-mentioned chiral agent A is used in the step 1A. The step 1A may be an aspect in which two or more types of chiral agents A are used, or may be an aspect in which at least one chiral agent A and at least one chiral agent whose helical twisting power does not change upon irradiation with light (hereinafter, simply referred to as "chiral agent B") are used.

The chiral agent B may be liquid crystalline or non-liquid crystalline. The chiral agent B generally contains an asymmetric carbon atom in many cases. The chiral agent B may be an axial asymmetric compound or planar asymmetric compound that does not contain an asymmetric carbon atom.

The chiral agent B may have a polymerizable group. Examples of the type of the polymerizable group include polymerizable groups that the chiral agent A may have.

A known chiral agent can be used as the chiral agent B.

The chiral agent B is preferably a chiral agent that induces a helix in a direction opposite to the direction of the helix induced by the chiral agent A. That is, for example, in a case where the helix induced by the chiral agent A is right-handed, the helix induced by the chiral agent B is left-handed.

The molar absorption coefficient of each of the chiral agent A and the chiral agent B is not particularly limited. The molar absorption coefficient at a wavelength (for example, 365 nm) of light for irradiation in the step 3A which will be described later is preferably 100 to 100,000 L/(mol·cm) and more preferably 500 to 50,000 L/(mol·cm).

The content of each of the chiral agent A and the chiral agent B in the composition layer can be appropriately set according to the properties (for example, retardation and wavelength dispersion) of an optically anisotropic layer to be formed. Since the twisted angle of the liquid crystal compound in the optically anisotropic layer largely depends on the types and addition concentrations of the chiral agent A and the chiral agent B, it is possible to control the alignment state of the liquid crystal compound by adjusting these factors.

In the step 1A, the chiral agent is contained in the composition layer so that a cholesteric liquid crystalline phase is formed in the step 2A which will be described later.

The total content of the chiral agent (total content of all the chiral agents) in the composition layer is not particularly limited and is preferably more than 5.0% by mass, more preferably 5.5% by mass or more, and still more preferably 6.0% by mass or more with respect to the total mass of the liquid crystal compound, from the viewpoint that it is easy to control the alignment state of the liquid crystal compound. The upper limit of the total content of the chiral agent is not particularly limited, and is preferably 25% by mass or less, more preferably 20% by mass or less, and still more preferably 15% by mass or less.

The content of the chiral agent A in the chiral agent is not particularly limited, and is preferably 5% to 95% by mass and more preferably 10% to 90% by mass with respect to the total mass of the chiral agent, from the viewpoint that it is easy to control the alignment state of the liquid crystal compound.

(Liquid Crystal Compound)

The composition layer of the step 1A contains a liquid crystal compound having a polymerizable group.

The type of the liquid crystal compound is not particularly limited. Generally, the liquid crystal compound can be classified into a rod-like type (rod-like liquid crystal compound) and a disk-like type (discotic liquid crystal compound) depending on the shape thereof. Further, the liquid crystal compound can be classified into a low molecular weight type and a high molecular weight type. The high molecular weight generally refers to having a polymerization degree of 100 or more (Polymer Physics-Phase Transition Dynamics, Masao Doi, p. 2, Iwanami Shoten Publishers, 1992). Any liquid crystal compound can be used in the present invention, and it is preferable to use a rod-like liquid crystal compound or a discotic liquid crystal compound and it is more preferable to use a rod-like liquid crystal compound. Two or more types of rod-like liquid crystal compounds, two or more types of discotic liquid crystal compounds, or a mixture of a rod-like liquid crystal compound and a discotic liquid crystal compound may be used.

For example, rod-like liquid crystal compounds described in claim 1 of JP1999-513019A (JP-H11-513019A) and paragraphs [0026] to [0098] of JP2005-289980A can be preferably used as the rod-like liquid crystal compound.

For example, discotic liquid crystal compounds described in paragraphs [0020] to [0067] of JP2007-108732A and paragraphs [0013] to [0108] of JP2010-244038A can be preferably used as the discotic liquid crystal compound.

The type of the polymerizable group contained in the liquid crystal compound is not particularly limited, and is preferably a functional group capable of an addition polymerization reaction, more preferably a polymerizable ethylenic unsaturated group or a ring-polymerizable group, and still more preferably a (meth)acryloyl group, a vinyl group, a styryl group, or an allyl group.

The optically anisotropic layer produced in the present invention is a layer formed by fixing a liquid crystal compound having a polymerizable group (a rod-like liquid crystal compound or discotic liquid crystal compound having a polymerizable group) by means of polymerization or the like. After being formed into a layer, the optically anisotropic layer no longer needs to exhibit liquid crystallinity.

The content of the liquid crystal compound in the composition layer is not particularly limited, and is preferably 60% by mass or more and more preferably 70% by mass or more with respect to the total mass of the composition layer, from the viewpoint that it is easy to control the alignment state of the liquid crystal compound. The upper limit of the content of the liquid crystal compound is not particularly limited, and is preferably 99% by mass or less and more preferably 97% by mass or less.

The definition of the leveling agent is as described above.

The content of the leveling agent in the composition layer is not particularly limited, and is preferably 0.010% by mass or more and more preferably 0.020% by mass or more with respect to the total mass of the composition layer, from the viewpoint that it is easy to control the alignment state of the liquid crystal compound. The upper limit of the content of the leveling agent is not particularly limited, and is preferably 5.000%% by mass or less and more preferably 2.000% by mass or less.

(Other Components)

The composition layer may contain components other than the chiral agent, the liquid crystal compound, and the leveling agent.

For example, the composition layer may contain a polymerization initiator. In a case where the composition layer contains a polymerization initiator, the polymerization of the liquid crystal compound having a polymerizable group proceeds more efficiently.

The polymerization initiator may be, for example, a known polymerization initiator, examples of which include a photopolymerization initiator and a thermal polymerization initiator, among which a photopolymerization initiator is preferable. In particular, a polymerization initiator that is photosensitized by the light for irradiation in the step 5A which will be described later is preferable.

The polymerization initiator is preferably such that the molar absorption coefficient that is the maximum among the wavelengths of light for irradiation in the step 3A is 0.1 times or less the molar absorption coefficient that is the maximum among the wavelengths of light for irradiation in the step 5A.

In addition, the molar absorption coefficient at the wavelength of light irradiation in the step 3A of the polymerization initiator is preferably 5,000 L/(mol·cm) or less, more preferably 4,000 L/(mol·cm) or less, and still more preferably 3,000 L/(mol·cm) or less from the viewpoint that a predetermined optically anisotropic layer is easily formed. The lower limit of the molar absorption coefficient of the polymerization initiator is not particularly limited and is preferably 0 L/(mol·cm), but is often 30 L/(mol·cm) or more.

The content of the polymerization initiator in the composition layer is not particularly limited, and is preferably 0.01% to 20% by mass and more preferably 0.5% to 10% by mass with respect to the total mass of the composition layer.

The composition layer may contain a photosensitizer.

The type of the photosensitizer is not particularly limited, and examples thereof include a known photosensitizer.

In addition, the molar absorption coefficient at the wavelength of light irradiation in the step 3A of the photosensitizer is preferably 5,000 L/(mol·cm) or less, more preferably 4,800 L/(mol·cm) or less, and still more preferably 4,500 L/(mol·cm) or less from the viewpoint that a predetermined optically anisotropic layer is easily formed. The lower limit of the molar absorption coefficient of the photosensitizer is not particularly limited and is preferably 0 L/(mol·cm), but is often 30 L/(mol·cm) or more.

The content of the photosensitizer in the composition layer is not particularly limited, and is preferably 0.01% to 20% by mass and more preferably 0.5% to 10% by mass with respect to the total mass of the composition layer.

The composition layer may contain a polymerizable monomer different from the liquid crystal compound having a polymerizable group. Examples of the polymerizable monomer include a radically polymerizable compound and a cationically polymerizable compound, among which a polyfunctional radically polymerizable monomer is preferable. Examples of the polymerizable monomer include polymerizable monomers described in paragraphs [0018] to [0020] of JP2002-296423A.

The content of the polymerizable monomer in the composition layer is not particularly limited, and is preferably 1% to 50% by mass and more preferably 5% to 30% by mass with respect to the total mass of the liquid crystal compound.

The composition layer may contain a polymer. Examples of the polymer include cellulose esters. Examples of the cellulose ester include cellulose esters described in paragraph [0178] of JP2000-155216A.

The content of the polymer in the composition layer is not particularly limited, and is preferably 0.1% to 10% by mass and more preferably 0.1% to 8% by mass with respect to the total mass of the liquid crystal compound.

The composition layer may contain an additive (alignment control agent) that promotes horizontal alignment or vertical alignment in order to bring a liquid crystal compound into a horizontal alignment state or a vertical alignment state, in addition to the foregoing components.

(Substrate)

As will be described later, in a case of forming the composition layer, it is preferable to form the composition layer on a substrate.

The substrate is a plate that supports the composition layer.

The substrate is preferably a transparent substrate. The transparent substrate is intended to refer to a substrate having a visible light transmittance of 60% or more, which preferably has a visible light transmittance of 80% or more and more preferably 90% or more.

The thickness direction retardation value (Rth(550)) of the substrate at a wavelength of 550 nm is not particularly limited, and is preferably −110 to 110 nm and more preferably −80 to 80 nm.

The in-plane retardation value (Re(550)) of the substrate at a wavelength of 550 nm is not particularly limited, and is preferably 0 to 50 nm, more preferably 0 to 30 nm, and still more preferably 0 to 10 nm.

A polymer having excellent optical performance transparency, mechanical strength, heat stability, moisture shielding property, isotropy, and the like is preferable as the material for forming the substrate.

Examples of the polymer film that can be used as the substrate include a cellulose acylate film (for example, a cellulose triacetate film (refractive index: 1.48), a cellulose diacetate film, a cellulose acetate butyrate film, or a cellulose acetate propionate film), a polyolefin film such as polyethylene or polypropylene, a polyester film such as polyethylene terephthalate or polyethylene naphthalate, a polyether sulfone film, a polyacrylic film such as polymethylmethacrylate, a polyurethane film, a polycarbonate film, a polysulfone film, a polyether film, a polymethylpentene film, a polyether ketone film, a (meth)acrylic nitrile film, and a film of a polymer having an alicyclic structure (a norbornene-based resin (ARTON: trade name, manufactured by JSR Corporation), or an amorphous polyolefin (ZEONEX: trade name, manufactured by Zeon Corporation)).

Above all, the material for the polymer film is preferably triacetyl cellulose, polyethylene terephthalate, or a polymer having an alicyclic structure, and more preferably triacetyl cellulose.

The substrate may contain various additives (for example, an optical anisotropy adjuster, a wavelength dispersion adjuster, a fine particle, a plasticizer, an ultraviolet inhibitor, a deterioration inhibitor, and a release agent).

The thickness of the substrate is not particularly limited, and is preferably 10 to 200 μm, more preferably 10 to 100 μm, and still more preferably 20 to 90 μm. In addition, the substrate may consist of a plurality of layers laminated. In order to improve the adhesion of the substrate to the layer provided thereon, the surface of the substrate may be subjected to a surface treatment (for example, a glow discharge treatment, a corona discharge treatment, an ultraviolet (UV) treatment, or a flame treatment).

In addition, an adhesive layer (undercoat layer) may be provided on the substrate.

In addition, in order to impart slipperiness in a transport step and prevent a back surface and a front surface from sticking to each other after winding, a polymer layer in which inorganic particles having an average particle diameter of about 10 to 100 nm are mixed in a solid content mass ratio of 5% to 40% by mass may be disposed on one side of the substrate.

The substrate may be a so-called temporary support. That is, the substrate may be peeled off from the optically anisotropic layer after carrying out the production method of the present invention.

In addition, the surface of the substrate may be directly subjected to a rubbing treatment. That is, a substrate that has been subjected to a rubbing treatment may be used. The direction of the rubbing treatment is not particularly limited, and an optimum direction is appropriately selected according to the direction in which the liquid crystal compound is desired to be aligned.

A treatment method widely adopted as a liquid crystal alignment treatment step of a liquid crystal display (LCD) can be applied for the rubbing treatment. That is, a method of obtaining alignment by rubbing the surface of the substrate in a certain direction with paper, gauze, felt, rubber, nylon fiber, polyester fiber, or the like can be used.

An alignment film may be disposed on the substrate.

The alignment film can be formed by means such as rubbing treatment of an organic compound (preferably a polymer), oblique vapor deposition of an inorganic compound, formation of a layer having microgrooves, or accumulation of an organic compound (for example, w-tricosanoic acid, dioctadecylmethylammonium chloride, or methyl stearate) by the Langmuir-Blodgett method (LB film).

Further, there is also known an alignment film capable of expressing an alignment function by application of an electric field, application of a magnetic field, or irradiation with light (preferably polarized light).

The alignment film is preferably formed by a rubbing treatment of a polymer.

Examples of the polymer contained in the alignment film include a methacrylate-based copolymer, a styrene-based copolymer, a polyolefin, a polyvinyl alcohol and a modified polyvinyl alcohol, a poly(N-methylolacrylamide), a polyester, a polyimide, a vinyl acetate copolymer, a carboxymethyl cellulose, and a polycarbonate described in paragraph [0022] of JP1996-338913A (JP-H08-338913A). In addition, a silane coupling agent can also be used as the polymer.

Above all, a water-soluble polymer (for example, a poly (N-methylolacrylamide), a carboxymethyl cellulose, a gelatin, a polyvinyl alcohol, or a modified polyvinyl alcohol) is preferable; a gelatin, a polyvinyl alcohol, or a modified polyvinyl alcohol is more preferable; and a polyvinyl alcohol or a modified polyvinyl alcohol is still more preferable.

As described above, the alignment film can be formed by applying a solution containing the above-mentioned polymer which is an alignment film forming material and an optional additive (for example, a crosslinking agent) onto a substrate, followed by heat-drying (crosslinking) and a rubbing treatment.

(Procedure of Step 1A)

In the step 1A, a composition layer containing the above-mentioned components is formed, but the procedure is not particularly limited. For example, a method of applying a composition containing the above-mentioned chiral agent, liquid crystal compound having a polymerizable group, and leveling agent (composition for forming an optically anisotropic layer) onto a substrate, followed by a drying treatment if necessary (hereinafter, also simply referred to as "coating method"), and a method of separately forming a composition layer and transferring the formed layer onto a substrate can be mentioned. Above all, the coating method is preferable from the viewpoint of productivity.

Hereinafter, the coating method will be described in detail.

The composition used in the coating method contains the above-mentioned chiral agent, liquid crystal compound having a polymerizable group, leveling agent, and other components used as necessary (for example, a polymerization initiator, a polymerizable monomer, a surfactant, and a polymer).

The content of each component in the composition is preferably adjusted to be the content of each component in the composition layer described above.

The coating method is not particularly limited, and examples thereof include a wire bar coating method, an extrusion coating method, a direct gravure coating method, a reverse gravure coating method, and a die-coating method.

If necessary, a treatment for drying the coating film applied onto the substrate may be carried out after application of the composition. The solvent can be removed from the coating film by carrying out the drying treatment.

Since the leveling agent is likely to be present at a higher density on the air interface side or the substrate side in the composition layer, the above-described predetermined leveling agent distribution state can be achieved.

The film thickness of the coating film is not particularly limited and is preferably 0.1 to 20 more preferably 0.2 to 15 and still more preferably 0.5 to 10 µm.

The step 2A is a step of subjecting the composition layer to a heat treatment to align the liquid crystal compound in the composition layer to form a cholesteric liquid crystalline phase. Carrying out this step brings the liquid crystal compound in the composition layer into a predetermined alignment state.

With regard to heat treatment conditions, the optimum conditions are selected according to the liquid crystal compound used.

Above all, the heating temperature is often 25° C. to 250° C., more often 40° C. to 150° C., and still more often 50° C. to 130° C.

The heating time is often 0.1 to 60 minutes and more often 0.2 to 5 minutes.

The alignment state of the liquid crystal compound obtained in the step 2A changes according to the helical twisting power of the chiral agent described above.

The absolute value of the helical twisting power of the chiral agent in the composition layer formed in the step 1A is preferably 10 $\mu m^{-1}$ or more, more preferably 15 $\mu m^{-1}$ or more, and still more preferably 20 $\mu m^{-1}$ or more. The upper limit of the absolute value of the helical twisting power of the chiral agent is not particularly limited, and is often 250 $\mu m^{-1}$ or less and more often 200 $\mu m^{-1}$ or less.

In addition, in a case where two or more types of chiral agents are contained in the composition, the absolute value of the weighted average helical twisting power of the chiral agents in the composition layer formed in the step 1A is preferably within the above-described range.

The weighted average helical twisting power of the chiral agent is a total value obtained by dividing the product of the helical twisting power of each chiral agent contained in the composition layer and the concentration (% by mass) of each chiral agent in the composition layer by the total concentration (% by mass) of the chiral agents in the composition layer, in a case where two or more types of chiral agents are contained in the composition. The weighted average helical twisting power is represented by Expression (B), for example, in a case where two chiral agents (chiral agent X and chiral agent Y) are used in combination.

Expression (B) Weighted average helical twisting power ($\mu m^{-1}$)=(helical twisting power ($\mu m^{-1}$) of chiral agent X×concentration (% by mass) of chiral agent X in composition layer+helical twisting power ($\mu m^{-1}$) of chiral agent Y×concentration (% by mass) of chiral agent Y in composition layer)/(concentration (% by mass) of chiral agent X in composition layer+ concentration (% by mass) of chiral agent Y in composition layer)

However, in Expression (B), in a case where the helical direction of the chiral agent is right-handed, the helical twisting power has a positive value. In addition, in a case where the helical direction of the chiral agent is left-handed, the helical twisting power has a negative value. That is, for example, in a case of a chiral agent having a helical twisting power of 10 the helical twisting power is expressed as 10 $\mu m^{-1}$ in a case where the helical direction of the helix induced by the chiral agent is right-handed. On the other hand, in a case where the helical direction of the helix induced by the chiral agent is left-handed, the helical twisting power is expressed as −10 $\mu m^{-1}$.

<Step 3A>

The step 3A is a step of irradiating the composition layer with light for 50 seconds or less and at an irradiation amount of 300 mJ/cm$^2$ or less under the condition that the oxygen concentration is 1% by volume or more, after the step 2A. In the following, the mechanism of this step will be described with reference to the accompanying drawings. The aspect shown in FIG. 4 corresponds to an aspect in which the liquid crystal compound LC forms a cholesteric liquid crystalline phase.

Figure 4:
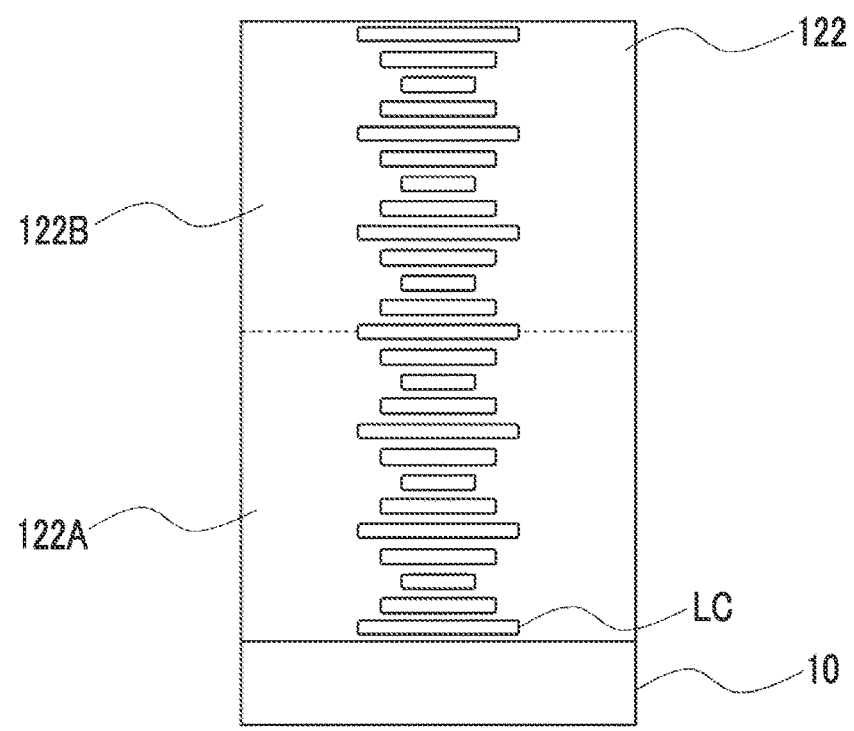
FIG. 4 is a cross-sectional view of a composition layer for explaining an example of a step 3A of a method for producing the optically anisotropic layer that satisfies Requirement 1.
Figure 4:
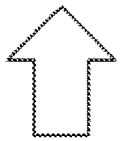

As shown in FIG. 4, in the step 3A, light irradiation is carried out from the direction opposite to a composition layer 122 side of the substrate 10 (the direction of the white arrow in FIG. 4) under the condition that the oxygen concentration is 1% by volume or more. Although the light irradiation is carried out from the substrate 10 side in FIG. 4, the light irradiation may be carried out from the composition layer 122 side.

At that time, in a case where a lower region 122A of the composition layer 122 on the substrate 10 side and an upper region 122B of the composition layer 122 opposite to the substrate 10 side are compared, the surface of the upper region 122B is on the air side, so that the oxygen concentration in the upper region 122B is high and the oxygen concentration in the lower region 122A is low. Therefore, in a case where the composition layer 122 is irradiated with light, the polymerization of the liquid crystal compound easily proceeds in the lower region 122A, and the alignment state of the liquid crystal compound is fixed. The chiral agent A is also present in the lower region 122A, and therefore the chiral agent A is also photosensitized, resulting in a change in the helical twisting power. However, since the alignment state of the liquid crystal compound is fixed in the lower region 122A, there is no change in the alignment state of the liquid crystal compound even in a case where the step 4A of subjecting the light-irradiated composition layer to a heat treatment, which will be described later, is carried out.

In addition, since the oxygen concentration is high in the upper region 122B, the polymerization of the liquid crystal compound is inhibited by oxygen and therefore the polymerization does not proceed easily even in a case where light irradiation is carried out. Since the chiral agent A is also present in the upper region 122B, the chiral agent A is photosensitized, resulting in a change in the helical twisting power. Therefore, in a case where the step 4A which will be described later is carried out, the alignment state of the liquid crystal compound changes along with the changed helical twisting power.

That is, the immobilization of the alignment state of the liquid crystal compound is likely to proceed in the substrate-side region (lower region) of the composition layer by carrying out the step 3A. In addition, the immobilization of the alignment state of the liquid crystal compound is difficult to proceed in the region of the composition layer (upper region) opposite to the substrate side, and the helical twisting power changes according to the photosensitized chiral agent A.

The step 3A is carried out under the condition that the oxygen concentration is 1% by volume or more. Above all, the oxygen concentration is preferably 2% by volume or more and more preferably 5% by volume or more from the viewpoint that regions having different alignment states of the liquid crystal compound are likely to be formed in the optically anisotropic layer. The upper limit of the oxygen concentration is not particularly limited and may be, for example, 100% by volume.

The light irradiation time in the step 3A is 50 seconds or shorter. From the viewpoint of easily forming a predetermined optically anisotropic layer and from the viewpoint of productivity, the light irradiation time is preferably 30 seconds or shorter and more preferably 10 seconds or shorter. The lower limit of the light irradiation time is not particularly limited, and is preferably 0.1 seconds or longer and more preferably 0.2 seconds or longer from the viewpoint of curing the liquid crystal compound.

The irradiation amount of light irradiation in the step 3A is 300 mJ/cm$^2$ or less. From the viewpoint of easily forming a predetermined optically anisotropic layer and from the viewpoint of productivity, the irradiation amount of light irradiation is preferably 250 mJ/cm$^2$ or less and more preferably 200 mJ/cm$^2$ or less. The lower limit of the irradiation amount of light irradiation is not particularly limited, and is preferably 1 mJ/cm$^2$ or more and more preferably 5 mJ/cm$^2$ or more from the viewpoint of curing the liquid crystal compound.

The light irradiation in the step 3A is preferably carried out at 15° C. to 70° C. (preferably 25° C. to 50° C.).

The light used for the light irradiation may be any light by which the chiral agent A is photosensitized. That is, the light used for the light irradiation is not particularly limited as long as it is an actinic ray or radiation that changes the helical twisting power of the chiral agent A, and examples thereof include an emission line spectrum of a mercury lamp, a far ultraviolet ray represented by an excimer laser, an extreme ultraviolet ray, an X-ray, an ultraviolet ray, and an electron beam. Above all, an ultraviolet ray is preferable.

<Step 4A>

The step 4A is a step of subjecting the composition layer to a heat treatment at a temperature higher than that upon irradiation with light, after the step 3A. Carrying out this step leads to a change in the alignment state of the liquid crystal compound in the region where the helical twisting power of the chiral agent A in the composition layer subjected to light irradiation changes. More specifically, this step is a step of subjecting the composition layer after the step 3A to a heat treatment at a temperature higher than that at the time of irradiation to align the liquid crystal compound in the composition layer not fixed in the step 3A.

In the following, the mechanism of this step will be described with reference to the accompanying drawings.

As described above, in a case where the step 3A is carried out on the composition layer 122 shown in FIG. 4, the alignment state of the liquid crystal compound is fixed in the lower region 122A, whereas the polymerization of the liquid crystal compound is difficult to proceed and the alignment state of the liquid crystal compound is not fixed in the upper region 122B. In addition, the helical twisting power of the chiral agent A changes in the upper region 122B. In a case where such a change in the helical twisting power of the chiral agent A occurs, the force of twisting the liquid crystal compound changes in the upper region 122B, as compared with the state before light irradiation. This point will be described in more detail.

In the following description, a case where the composition layer 122 contains the chiral agent A whose induced helical direction is left-handed and whose helical twisting power is reduced upon irradiation with light will be described in detail.

Figure 6:
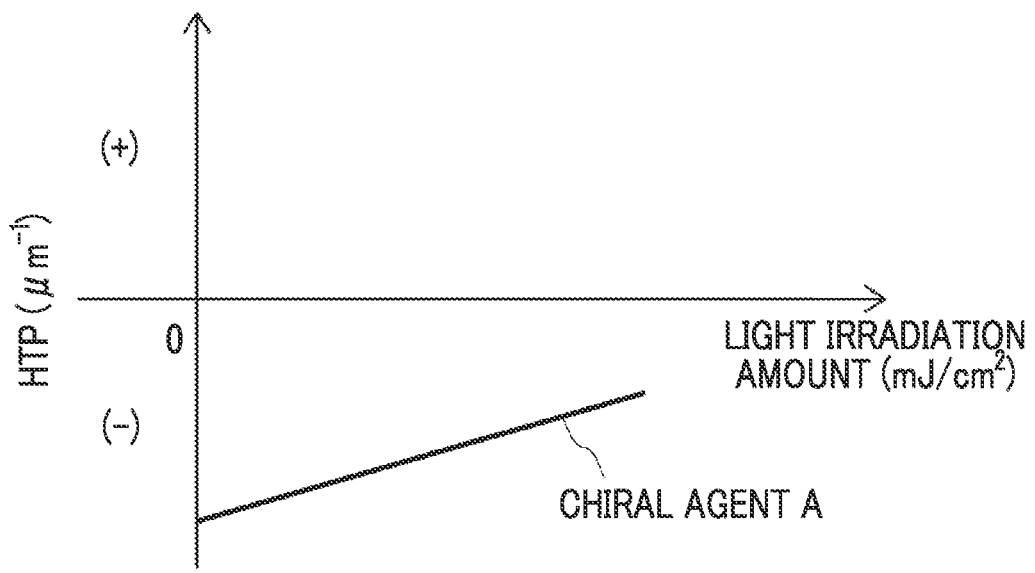
FIG. 6 is a schematic diagram of a graph plotting a relationship between a helical twisting power (HTP) ($\mu m^{-1}$) and a light irradiation amount ($mJ/cm^2$) for a chiral agent A.

In a case where light irradiation is carried out in the upper region 122B in such a state and then the helical twisting power of the chiral agent A decreases depending on the amount of light irradiation as shown in FIG. 6, the helical twisting power of the chiral agent in the upper region 122B decreases.

Figure 5:
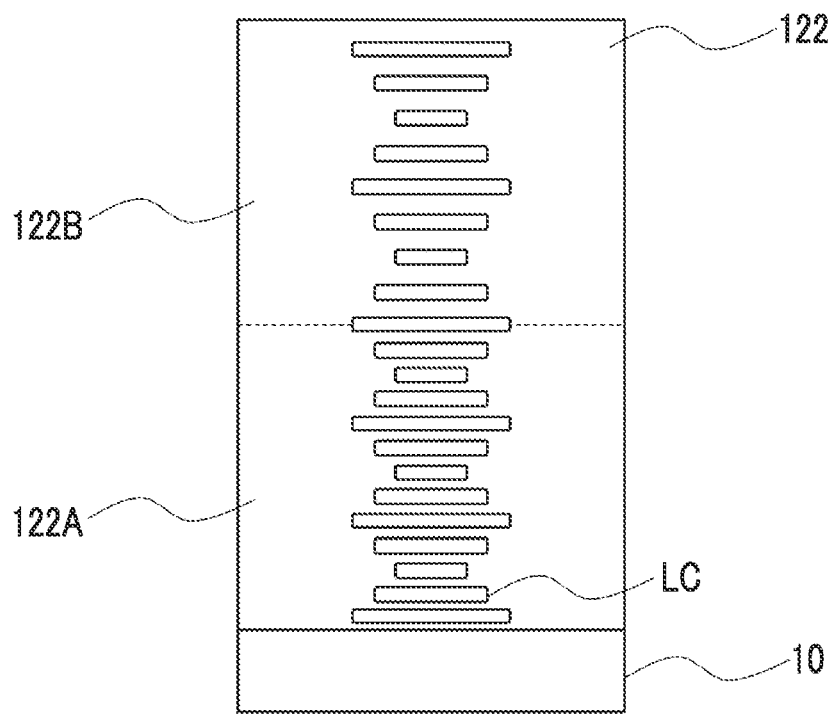
FIG. 5 is a cross-sectional view of a composition layer for explaining an example of a step 4A of the method for producing the optically anisotropic layer that satisfies Requirement 1.

Therefore, in a case where the composition layer 122 after the step 3A in which such a change in the helical twisting power occurred is subjected to a heat treatment to promote the realignment of the liquid crystal compound, the helical pitch of the cholesteric liquid crystal layer increases in the upper region 122B, as shown in FIG. 5.

On the other hand, as described above, the polymerization of the liquid crystal compound proceeds to fix the alignment state of the liquid crystal compound during the step 3A in the lower region 122A of the composition layer 122, so that the realignment of the liquid crystal compound does not proceed.

As described above, carrying out the step 4A leads to the formation of a plurality of cholesteric liquid crystalline phases having different helical pitches along the thickness direction of the composition layer.

The aspect in which a chiral agent whose helical twisting power decreases upon irradiation with light is used as the chiral agent A has been described in FIG. 4 and FIG. 5, but the present invention is not limited to this aspect. For example, a chiral agent whose helical twisting power increases upon irradiation with light may be used as the chiral agent A.

In addition, the aspect in which a chiral agent whose induced helical direction is left-handed is used as the chiral agent A has been described in FIG. 4 and FIG. 5, but the present invention is not limited to this aspect. For example, a chiral agent whose induced helical direction is right-handed may be used as the chiral agent A.

In addition, the aspect in which only one type of chiral agent A is used has been described in FIG. 4 and FIG. 5, but the present invention is not limited to this aspect. For example, it may be an aspect in which two types of chiral agents A are used, or an aspect in which the chiral agent A and the chiral agent B are used in combination.

The heat treatment is carried out at a temperature higher than that at the time of light irradiation.

The difference between the temperature of the heat treatment and the temperature at the time of light irradiation is preferably 5° C. or more, more preferably 10° C. to 110° C., and still more preferably 20° C. to 110° C.

The temperature of the heat treatment is preferably a temperature which is higher than the temperature at the time of light irradiation and at which the non-fixed liquid crystal compound in the composition layer is aligned. More specifically, the temperature of the heat treatment is often 40° C. to 250° C., more often 50° C. to 150° C., still more often higher than 50° C. and lower than or equal to 150° C., and particularly often 60° C. to 130° C.

The heating time is often 0.01 to 60 minutes and more often 0.03 to 5 minutes.

In addition, the absolute value of the helical twisting power of the chiral agent in the composition layer after light irradiation is not particularly limited, and the absolute value of the difference between the helical twisting power of the chiral agent in the composition layer after light irradiation and the helical twisting power of the chiral agent in the composition layer before light irradiation is preferably 0.05 $\mu m^{-1}$ or more, more preferably 0.05 to 10.0 $\mu m^{-1}$, and still more preferably 0.1 to 10.0 $\mu m^{-1}$.

In a case where two or more types of chiral agents are contained in the composition, the absolute value of the difference between the weighted average helical twisting power of the chiral agent in the composition layer after light irradiation and the weighted average helical twisting power of the chiral agent in the composition layer before light irradiation is preferably 0.05 $\mu m^{-1}$ or more, more preferably 0.05 to 10.0 $\mu m^{-1}$, and still more preferably 0.1 to 10.0 $\mu m^{-1}$.

<Step 5A>

The step 5A is a step of subjecting the composition layer to a curing treatment to form an optically anisotropic layer having a plurality of regions in which the alignment states of the liquid crystal compound are different along a thickness direction, after the step 4A. By carrying out this step, the alignment state of the liquid crystal compound in the composition layer is fixed, and as a result, a predetermined optically anisotropic layer is formed. Carrying out this step leads to the formation of an optically anisotropic layer which is formed by fixing a cholesteric liquid crystalline phase, and has a plurality of regions in which helical pitches of the cholesteric liquid crystalline phase are different along a thickness direction. The length of the helical pitch in each region formed is often constant. That is, carrying out this step makes it possible to form an optically anisotropic layer which is formed by fixing a cholesteric liquid crystalline phase and has a plurality of regions in which helical pitches of the cholesteric liquid crystalline phase are different along a thickness direction, each region having a constant helical pitch.

The method of the curing treatment is not particularly limited, and examples thereof include a photocuring treatment and a thermal curing treatment. Above all, a light irradiation treatment is preferable, and an ultraviolet irradiation treatment is more preferable.

For ultraviolet irradiation, a light source such as an ultraviolet lamp is used.

The irradiation amount of light (for example, ultraviolet rays) is not particularly limited, and is generally preferably about 100 to 800 $mJ/cm^2$.

The atmosphere at the time of light irradiation is not particularly limited. The light irradiation may be carried out under air or the light irradiation may be carried out under an inert atmosphere. In particular, the light irradiation is preferably carried out at an oxygen concentration of less than 1% by volume.

In a case where a photocuring treatment is carried out as the curing treatment, the temperature conditions at the time of photocuring are not particularly limited and the temperature may be any temperature at which the alignment state of the liquid crystal compound in the step 4A is maintained. The difference between the temperature of the heat treatment in the step 4A and the temperature at the time of the photocuring treatment is preferably 100° C. or less and more preferably 80° C. or less.

It is preferable that the temperature of the heat treatment in the step 4A and the temperature at the time of the photocuring treatment are the same, or the temperature at the time of the photocuring treatment is lower than the temperature of the heat treatment.

In addition, in the aspect shown in FIG. 5, the optically anisotropic layer has two regions in which the alignment states of the liquid crystal compound are different, but the present invention is not limited to the above aspect. The optically anisotropic layer may have three or more regions in which the alignment states of the liquid crystal compound are different. As described above, the optically anisotropic layer having three or more regions in which the alignment states of the liquid crystal compound are different can be formed, for example, by carrying out the step 3A a plurality of times while changing the conditions of the step 3A.

The optically anisotropic layer as described above may be, for example, an optically anisotropic layer which has, along a thickness direction, a region in which a cholesteric liquid crystalline phase that reflects blue light is fixed, a region in which a cholesteric liquid crystalline phase that reflects green light is fixed, and a region in which a cholesteric liquid crystalline phase that reflects red light is fixed.

<<Requirement 2>>

The optically anisotropic layer that satisfies Requirement 2 is an optically anisotropic layer formed by fixing an alignment state of a liquid crystal compound, and has a plurality of regions in which tilt angles of an alignment direction of the liquid crystal compound with respect to a surface of the optically anisotropic layer are different along a thickness direction.

Figure 7:
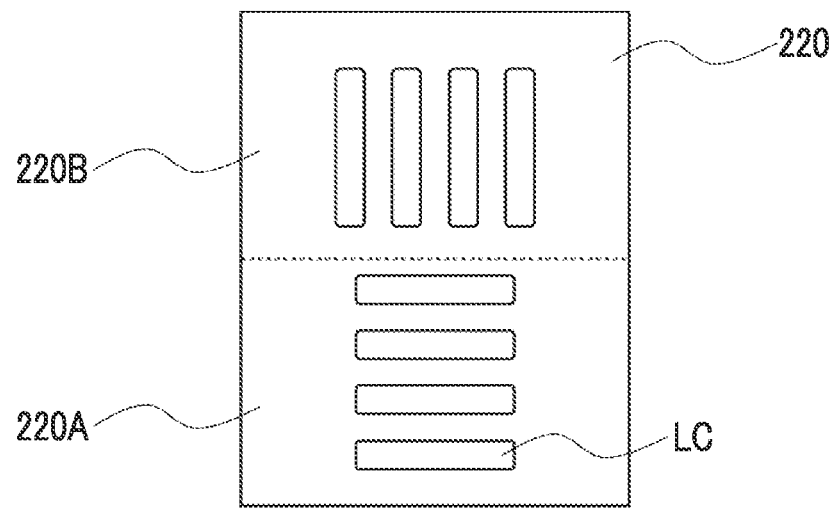
FIG. 7 is a cross-sectional view showing one embodiment of an optically anisotropic layer that satisfies Requirement 2.

FIG. 7 shows an embodiment of an optically anisotropic layer that satisfies Requirement 2.

An optically anisotropic layer 220 shown in FIG. 7 is an optically anisotropic layer formed by fixing the alignment state of the liquid crystal compound LC, and has a first region 220A and a second region 220B along a thickness direction. The first region 220A is a region formed by fixing the alignment state of a liquid crystal compound homogeneously aligned (horizontally aligned), and the second region 220B is a region formed by fixing the alignment state of a liquid crystal compound homeotropically aligned (vertically aligned).

The homogeneous alignment in the present specification refers to a state in which a molecular axis of a liquid crystal compound (for example, a major axis in a case of a rod-like liquid crystal compound) is arranged horizontally and in the same direction with respect to the surface of the layer (optical uniaxiality).

Here, the "horizontal" does not require that the molecular axis of the liquid crystal compound is strictly horizontal with respect to the surface of the layer, but is intended to mean an alignment in which the tilt angle formed by the average molecular axis of the liquid crystal compound in the layer and the surface of the layer is less than 20°.

In addition, the "same direction" does not require that the molecular axis of the liquid crystal compound is arranged strictly in the same direction with respect to the surface of the layer, but is intended to mean that, in a case where the direction of the slow axis is measured at any 20 positions in the plane, the maximum difference between the slow axis directions among the slow axis directions at 20 positions (the difference between the two slow axis directions having a maximum difference among the 20 slow axis directions) is less than 10°.

In addition, the "homeotropic alignment" in the present specification refers to a state in which a molecular axis of a liquid crystal compound (for example, a major axis in a case of a rod-like liquid crystal compound) is arranged vertically and in the same direction with respect to the surface of the layer (optical uniaxiality).

Here, the "vertical" does not require that the molecular axis of the liquid crystal compound is strictly vertical with respect to the surface of the layer, but is intended to mean an alignment in which the tilt angle formed by the average molecular axis of the liquid crystal compound in the layer and the normal line of the surface of the layer is less than 20°.

In addition, the "same direction" does not require that the molecular axis of the liquid crystal compound is arranged strictly in the same direction with respect to the surface of the layer, but is intended to mean that, in a case where the direction of the molecular axis of the liquid crystal compound is measured at any 20 positions, the maximum difference among the directions of the molecular axis of the liquid crystal compound at 20 positions (the difference between the two directions of the molecular axis of the liquid crystal compound having a maximum difference among the 20 directions of the molecular axis of the liquid crystal compound) is less than 10°.

In a case where the thickness of the first region 220A is defined as d1 and the in-plane refractive index anisotropy of the first region 220A measured at a wavelength of 550 nm is defined as $\Delta n1$, the first region 220A preferably satisfies Expression (1-1) from the viewpoint that an optically anisotropic layer can be suitably applied to a circularly polarizing plate and from the viewpoint that an optically anisotropic layer can be suitably applied to an optical compensation plate of a liquid crystal display device.

$$100 \text{ nm} \leq \Delta n1 d1 \leq 180 \text{ nm} \quad \text{Expression (1-1)}$$

Above all, the first region 220A more preferably satisfies Expression (1-2).

$$110 \text{ nm} \leq \Delta n1 d1 \leq 170 \text{ nm} \quad \text{Expression (1-2)}$$

In addition, in a case where the thickness of the second region 220B is defined as d2 and the in-plane refractive index anisotropy of the second region 220B measured at a wavelength of 550 nm is defined as $\Delta n2$, the second region 220B preferably satisfies Expression (2-1) from the viewpoint that an optically anisotropic layer can be suitably applied to a circularly polarizing plate and from the viewpoint that light leakage in an oblique direction can be reduced in a case where an optically anisotropic layer is applied as an optical compensation plate of a liquid crystal display device.

$$0 \text{ nm} \leq \Delta n2 d2 \leq 30 \text{ nm} \quad \text{Expression (2-1)}$$

Above all, the second region 220B more preferably satisfies Expression (2-2).

$$0 \text{ nm} \leq \Delta n2 d2 \leq 20 \text{ nm} \quad \text{Expression (2-2)}$$

The thickness direction retardation of the second region 220B at a wavelength of 550 nm is preferably −150 to −20 nm and more preferably −120 to −20 nm.

The optically anisotropic layer satisfying Requirement 2 preferably exhibits reverse wavelength dispersibility.

That is, it is preferable that Re(450), which is the in-plane retardation of the optically anisotropic layer measured at a wavelength of 450 nm, Re(550), which is the in-plane retardation of the optically anisotropic layer measured at a wavelength of 550 nm, and Re(650), which is the in-plane retardation of the optically anisotropic layer measured at a wavelength of 650 nm, have a relationship of Re(450)≤Re(550)≤Re(650).

The optical properties of the optically anisotropic layer satisfying Requirement 2 are not particularly limited, and it is preferable that the optically anisotropic layer functions as a λ/4 plate or as an optical compensation plate of a liquid crystal display device.

The λ/4 plate is a plate having a function of converting linearly polarized light having a certain specific wavelength into circularly polarized light (or converting circularly polarized light into linearly polarized light), and refers to a plate (optically anisotropic layer) in which an in-plane retardation Re(λ) at a specific wavelength λ nm satisfies Re(λ)=λ/4.

This expression may be achieved at any wavelength in a visible light range (for example, 550 nm), and the in-plane retardation Re(550) at a wavelength of 550 nm preferably satisfies a relationship of 100 nm≤Re(550)≤180 nm.

In the above aspect, the optically anisotropic layer having, along a thickness direction, a region formed by fixing the alignment state of a liquid crystal compound homeotropically aligned and a region formed by fixing the alignment state of a liquid crystal compound homogeneously aligned has been described in detail, but the present invention is not limited to this aspect as long as the optically anisotropic layer includes a plurality of regions in which tilt angles of the alignment direction of the liquid crystal compound with respect to the surface of the layer are different.

With regard to the alignment state of the liquid crystal compound, for example, in a case where the liquid crystal compound is a rod-like liquid crystal compound, the alignment state thereof includes, for example, nematic alignment (a state in which a nematic phase is formed), smectic alignment (a state in which a smectic phase is formed), cholesteric alignment (a state in which a cholesteric phase is formed), and hybrid alignment. In a case where the liquid crystal compound is a discotic liquid crystal compound, the alignment state thereof includes nematic alignment, columnar alignment (a state in which a columnar phase is formed), and cholesteric alignment.

More specifically, the optically anisotropic layer may be an optically anisotropic layer having a region formed by fixing the alignment state of a liquid crystal compound tilt-aligned and a region formed by fixing the alignment state of a liquid crystal compound homogeneously aligned.

The method for producing the optically anisotropic layer that satisfies Requirement 2 is not particularly limited, and is preferably a production method having the following steps 1B to 5B.

Step 1B: a step of forming a composition layer containing a photosensitive compound whose polarity changes upon irradiation with light, a liquid crystal compound having a polymerizable group, and a leveling agent Step 2B: a step of subjecting the composition layer to a heat treatment to align the liquid crystal compound in the composition layer Step 3B: a step of irradiating the composition layer with light for 50 seconds or less and at an irradiation amount of 300 mJ/cm² or less under the condition that the oxygen concentration is 1% by volume or more, after the step 2B Step 4B: a step of subjecting the composition layer to a heat treatment at a temperature higher than that upon irradiation with light, after the step 3B Step 5B: a step of subjecting the composition layer to a curing treatment to form an optically anisotropic layer having a plurality of regions in which the alignment states of the liquid crystal compound are different along a thickness direction, after the step 4B As will be described later, a photosensitive compound whose polarity changes upon irradiation with light is used in the present production method.

Hereinafter, the procedure of each of the above-mentioned steps will be described in detail.

<Step 1B>

The step 1B is a step of forming a composition layer containing a photosensitive compound whose polarity changes upon irradiation with light and a liquid crystal compound having a polymerizable group. Carrying out this step leads to the formation of a composition layer to be subjected to a light irradiation treatment which will be described later.

Definitions and contents of the liquid crystal compound and the leveling agent contained in the composition layer are as described in the step 1A.

In addition, as described in the step 1A, the composition layer may contain other components.

(Photosensitive Compound Whose Polarity Changes Upon Irradiation with Light)

The composition layer of the step 1B contains a photosensitive compound whose polarity changes upon irradiation with light (hereinafter, also referred to as "specific photosensitive compound").

The photosensitive compound whose polarity changes upon irradiation with light is a compound whose polarity changes before and after irradiation with light. As will be described later, in a case where the composition layer containing such a specific photosensitive compound is irradiated with light in the step 1B, the polarity of the specific photosensitive compound changes in the air-side region in the composition layer, and then in a case where the step 4B is carried out, the alignment direction of the liquid crystal compound is tilted or perpendicular to the surface of the layer as the polarity of the specific photosensitive compound changes.

The change in the polarity of the specific photosensitive compound may be a change that makes the specific photosensitive compound hydrophilized or a change that makes the specific photosensitive compound hydrophobized. Above all, the change that makes the specific photosensitive compound hydrophilized is preferable from the viewpoint that an alignment state of the liquid crystal compound in which the alignment direction of the liquid crystal compound is tilt-aligned or vertically aligned with respect to the surface of the layer can be easily formed.

A compound having a group that produces a hydrophilic group upon irradiation with light is preferable as the specific photosensitive compound that is hydrophilized upon irradiation with light. The type of the hydrophilic group is not particularly limited and may be any of a cationic group, an anionic group, and a nonionic group, more specific examples of which include a carboxylic acid group, a sulfonic acid group, a phosphonic acid group, an amino group, an ammonium group, an amide group, a thiol group, and a hydroxy group.

The specific photosensitive compound preferably has a fluorine atom or a silicon atom. In a case where the specific photosensitive compound has the above-described atom, the specific photosensitive compound is likely to be present at a higher density in the vicinity of the surface of the composition layer and therefore a desired optically anisotropic layer is likely to be formed.

A compound represented by Formula (X) is preferable as the specific photosensitive compound.

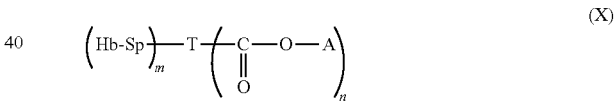

In Formula (X),

T represents an n+m-valent aromatic hydrocarbon group,

Sp represents a single bond or a divalent linking group,

Hb represents a fluorine-substituted alkyl group having 4 to 30 carbon atoms, m represents an integer of 1 to 4, n represents an integer of 1 to 4, and A represents a group represented by Formula (Y),

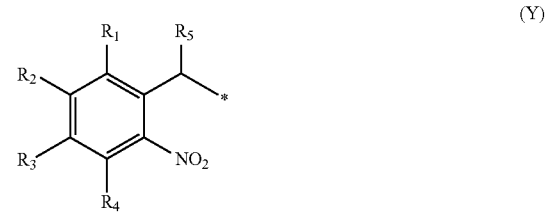

In Formula (Y),

R1 to R5 each independently represent a hydrogen atom or a monovalent substituent, and

* represents a bonding site.

In Formula (X), in a case where there are a plurality of each of Sp, Hb, or A, the plurality of Sp's, the plurality of Hb's, or the plurality of A's each may be the same as or different from each other.

In Formula (X), T represents an n+m-valent aromatic hydrocarbon group.

The aromatic hydrocarbon group is not particularly limited as long as it is a group obtained by removing n+m hydrogen atoms from the aromatic hydrocarbon ring. The aromatic hydrocarbon group preferably has 6 to 22 carbon atoms, more preferably 6 to 14 carbon atoms, and still more preferably 6 to 10 carbon atoms. It is particularly preferable that the aromatic hydrocarbon group is a benzene ring.

The aromatic hydrocarbon group may further have a substituent in addition to the group represented by -Sp-Hb and the group represented by —C(=O)O-A. Examples of the substituent include an alkyl group (for example, an alkyl group having 1 to 8 carbon atoms), an alkoxy group (for example, an alkoxy group having 1 to 8 carbon atoms), a halogen atom (for example, a fluorine atom, a chlorine atom, a bromine atom, or an iodine atom), a cyano group, and an acyloxy group (for example, an acetoxy group).

In Formula (X), Sp represents a single bond or a divalent linking group, and is preferably a divalent linking group.

The divalent linking group is not particularly limited, and is preferably a linking group selected from the group consisting of a linear or branched alkylene group (preferably having 1 to 20 carbon atoms, more preferably 1 to 10 carbon atoms, and still more preferably 1 to 6 carbon atoms), a linear or branched alkenylene group (preferably having 2 to 20 carbon atoms, more preferably 2 to 10 carbon atoms, and still more preferably 2 to 6 carbon atoms), a linear or branched alkynylene group (preferably having 2 to 20 carbon atoms, more preferably 2 to 10 carbon atoms, and still more preferably 2 to 6 carbon atoms), and a group in which one or two or more —CH$_2$— in the foregoing alkylene group, alkenylene group, or alkynylene group are substituted with a "divalent organic group" shown below.

Above all, from the viewpoint of further improving the solubility, the divalent linking group is preferably an alkylene group having 1 to 10 carbon atoms in which one or two or more —CH$_2$— are substituted with a "divalent organic group" shown below.

(Divalent Organic Group)

Examples of the divalent organic group include —O—, —S—, —C(=O)—, —C(=O)O—, —OC(=O)—, —C(=O)S—, —SC(=O)—, —NR$_6$C(=O)—, and —C(=O)NR$_6$—. Among the above divalent organic groups, —O—, —S—, —C(=O)—, —C(=O)O—, —OC(=O)—, —C(=O)S—, or SC(=O)— is more preferable, —C(=O)—, —C(=O)O—, or OC(=O)— is still more preferable, and —O—, —C(=O)O—, or OC(=O)— is particularly preferable, from the viewpoint of further progress of hydrophilization.

In addition, R$_6$ represents a hydrogen atom or an alkyl group having 1 to 6 carbon atoms.

In a case where the divalent organic group is contained in the divalent linking group, it is preferable that the divalent organic groups are not adjacent to each other.

In Formula (X), Hb represents a fluorine-substituted alkyl group having 4 to 30 carbon atoms.

Hb preferably has 4 to 20 carbon atoms and more preferably 4 to 10 carbon atoms. Here, the fluorine-substituted alkyl group may be a perfluoroalkyl group in which all hydrogen atoms are substituted with fluorine atoms, or a fluoroalkyl group in which hydrogen atoms are partially substituted with fluorine atoms. In addition, the fluorine-substituted alkyl group may be chain-like, branched, or cyclic, and is preferably chain-like or branched and more preferably chain-like.

Above all, a structure that is a perfluoroalkyl group is preferable as the fluorine-substituted alkyl group.

In Formula (X), a suitable aspect of the group represented by -Sp-Hb is exemplified below.

In the following examples, * represents a connection position to T.

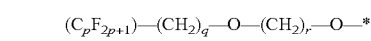

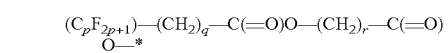

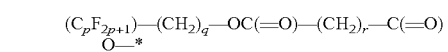

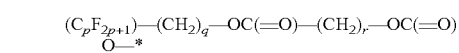

In the group represented by -Sp-Hb, p is preferably 4 to 30, more preferably 4 to 20, and still more preferably 4 to 10. q is preferably 0 to 6, more preferably 0 to 4, and still more preferably 0 to 3. r is preferably 1 to 6, more preferably 1 to 4, and still more preferably 1 to 3.

In addition, the total number of carbon atoms in the portion other than the perfluoro group is preferably 10 or less.

In Formula (X), n and m each independently represent an integer of 1 to 4.

From the viewpoint that hydrophilization further progresses, n is preferably 2 or more.

m is preferably 1 to 3 and more preferably 2.

In Formula (X), A represents a group represented by Formula (Y).

Hereinafter, Formula (Y) will be described.

In Formula (Y), R$_1$ to R$_5$ each independently represent a hydrogen atom or a monovalent substituent. The monovalent substituent represented by R$_1$ to R$_5$ is not particularly limited.

Examples of the monovalent substituent represented by R$_1$ to R$_4$ include a halogen atom (for example, a fluorine atom, a chlorine atom, a bromine atom, or an iodine atom), a hydroxy group, a cyano group, a substituted or unsubstituted amino group (which is represented by —N(R$_A$)$_2$ where two R$_A$'s each independently represent a hydrogen atom or a monovalent organic group (for example, an alkyl group having 1 to 5 carbon atoms as the monovalent organic group), an alkoxy group having 1 to 8 carbon atoms (for example, a methoxy group or an ethoxy group), an amide group having 2 to 8 carbon atoms (for example, —N(R$_B$)C(=O)R$_C$ where R$_B$ represents a hydrogen atom or a monovalent organic group (for example, an alkyl group having 1 to 5 carbon atoms as the monovalent organic group), and R$_C$ represents a monovalent organic group (for example, an alkyl group having 1 to 5 carbon atoms as the monovalent organic group) or —C(=O)N(R$_D$)$_2$ where two R$_D$'s each independently represent a hydrogen atom or a monovalent organic group (for example, an alkyl group having 1 to 5 carbon atoms)), an alkoxycarbonyl group having 2 to 8 carbon atoms (for example, —C(=O)OCH$_3$), an acyloxy group having 2 to 8 carbon atoms (for example, —OC(=O)CH$_3$), and -Sp$_A$-Hb$_A$.

Sp$_A$ and Hb$_A$ each have the same definition as Sp and Hb of Formula (X), and preferred aspects thereof are also the same. In Formula (Y), in a case where a plurality of R$_1$ to R$_4$ represent -Sp$_A$-Hb$_A$, a plurality of Sp$_A$'s and a plurality of Hb$_A$'s each may be the same as or different from each other.

Above all, $R_1$ to $R_4$ are preferably each independently a hydrogen atom, a halogen atom, a hydroxy group, a cyano group, an alkoxy group, —$NH_2$, —$NH(CH_3)$, —$N(CH_3)_2$, —$C(=O)OCH_3$, —$OC(=O)CH_3$, —$NHC(=O)CH_3$, —$N(CH_3)C(=O)CH_3$, or -$Sp_A$-$Hb_A$.

In particular, from the viewpoint that the decomposition rate of the compound represented by Formula (X) upon exposure to light is further increased to further promote hydrophilization and/or the aligning properties are further enhanced, $R_1$ to $R_4$ are more preferably each independently —$OCH_3$ or -$Sp_A$-$Hb_A$. In a case of —$OCH_3$, since an ether oxygen is contained in the structure thereof (in particular, the position bonded to the benzene ring in Formula (Y) is an ether oxygen), the decomposition rate of the compound represented by Formula (X) upon exposure to light tends to further increase to further promote hydrophilization. On the other hand, in a case of -$Sp_A$-$Hb_A$, the aligning properties tend to be further increased due to the presence of $Hb_A$. In a case where $Sp_A$ contains an ether oxygen in the structure thereof (in particular, in a case where an ether oxygen is contained at the terminal of Sp A opposite to the side bonded to $Hb_A$ (in other words, the terminal on the side connected to the benzene ring of Formula (Y)), the effect of accelerating the decomposition rate is obtained, as in the case of —$OCH_3$.

Further, from the viewpoint that the decomposition rate of the compound represented by Formula (X) upon exposure to light is further increased to further promote hydrophilization, it is preferable that at least two of $R_1$ to $R_4$ are each independently —$OCH_3$ or -$Sp_B$-$Hb_B$ and it is more preferable that $R_2$ and $R_3$ are each independently —$OCH_3$ or -$Sp_B$-$Hb_B$.

Here, $Sp_B$ represents an alkylene group having 1 to 10 carbon atoms in which —$CH_2$— is substituted with —O—. Above all, as described above, in a case where an ether oxygen is contained at the terminal of $Sp_B$ opposite to the side bonded to $Hb_B$ (in other words, the terminal on the side connected to the benzene ring of Formula (Y)), the effect of accelerating the decomposition rate is obtained more remarkably, and therefore the hydrophilization proceeds further. In a case where —$CH_2$— in the alkylene group is substituted with a plurality of —O-'s, it is preferable that —O-'s are not adjacent to each other. The alkylene group more preferably has 1 to 7 carbon atoms, still more preferably 1 to 6 carbon atoms, and particularly preferably 1 to 4 carbon atoms. In addition, the alkylene group may be linear or branched, and is preferably linear.

$Hb_B$ represents a fluorine-substituted alkyl group having 4 to 30 carbon atoms. The suitable aspect of $Hb_B$ is the same as that of Hb of Formula (X) described above.

In Formula (Y), in a case where a plurality of $R_1$ to $R_4$ represent -$Sp_B$-$Hb_B$, a plurality of $Sp_B$'s and a plurality of $Hb_B$'s each may be the same as or different from each other.

Above all, from the viewpoint of accelerating the decomposition rate of the compound represented by Formula (X) upon exposure to light to further promote hydrophilization and further enhancing the aligning properties, it is preferable that at least two of $R_1$ to $R_4$ are -$Sp_B$-$Hb_B$ and it is more preferable that both $R_2$ and $R_3$ are -$Sp_B$-$Hb_B$. In particular, a structure represented by Formula (Z) is preferable as -$Sp_B$-$Hb_B$.

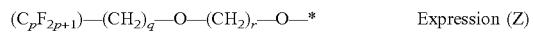

Expression (Z)

In Formula (Z), p is preferably 4 to 30, more preferably 4 to 20, and still more preferably 4 to 10. q is preferably 0 to 5, more preferably 0 to 4, and still more preferably 0 to 3. r is preferably 1 to 5, more preferably 1 to 4, and still more preferably 1 to 3.

In Formula (Y), $R_5$ is preferably a hydrogen atom, a methyl group, an ethyl group, or an aromatic group.

The aromatic group is not particularly limited, and is preferably an aromatic group having 6 to 14 carbon atoms, more preferably an aromatic group having 6 to 10 carbon atoms, and still more preferably a phenyl group.

Above all, from the viewpoint of accelerating the decomposition rate of the compound represented by Formula (X) upon exposure to light to further promote hydrophilization, $R_5$ is preferably a methyl group, an ethyl group, or an aromatic group, more preferably an ethyl group or an aromatic group, and still more preferably an aromatic group.

In addition, in Formula (Y), * represents a bonding site with $C(=O)O$— in Formula (X).

The compound represented by Formula (X) may have a molecular structure having symmetry or may have a molecular structure having asymmetry. Here, the "symmetry" means that it corresponds to any of point symmetry, line symmetry, and rotational symmetry, and the "asymmetry means that it does not correspond to any of point symmetry, line symmetry, and rotational symmetry.

In addition, in the compound represented by Formula (X), in a case where there are a plurality of each of Sp, Hb, or A, the plurality of Sp's, the plurality of Hb's, or the plurality of A's each may be the same as or different from each other.

The content of the specific photosensitive compound in the composition layer can be appropriately set according to the properties (for example, retardation and wavelength dispersion) of an optically anisotropic layer to be formed.

Above all, from the viewpoint that it is easier to form an optically anisotropic layer having a predetermined structure, the content of the specific photosensitive compound is preferably 0.01% to 10% by mass and more preferably 0.05% to 5% by mass with respect to the total mass of the liquid crystal compound.

In the step 1A, a composition layer containing the above-mentioned components is formed, but the procedure is not particularly limited. For example, a method of applying a composition containing the above-mentioned specific photosensitive compound, liquid crystal compound having a polymerizable group, and leveling agent onto a substrate, followed by a drying treatment if necessary (hereinafter, also simply referred to as "coating method"), and a method of separately forming a composition layer and transferring the formed layer onto a substrate can be mentioned. Above all, the coating method is preferable from the viewpoint of productivity.

Hereinafter, the coating method will be described in detail.

The composition used in the coating method contains the above-mentioned specific photosensitive compound, liquid crystal compound having a polymerizable group, leveling agent, and other components used as necessary (for example, a polymerization initiator, a polymerizable monomer, a surfactant, and a polymer).

The content of each component in the composition is preferably adjusted to be the content of each component in the composition layer described above.

The coating method is not particularly limited, and examples thereof include a wire bar coating method, an extrusion coating method, a direct gravure coating method, a reverse gravure coating method, and a die-coating method.

If necessary, a treatment for drying the coating film applied onto the substrate may be carried out after application of the composition. The solvent can be removed from the coating film by carrying out the drying treatment.

The film thickness of the coating film is not particularly limited and is preferably 0.1 to 20 more preferably 0.2 to 15 and still more preferably 0.5 to 10 μm.

<Step 2B>

Figure 8:
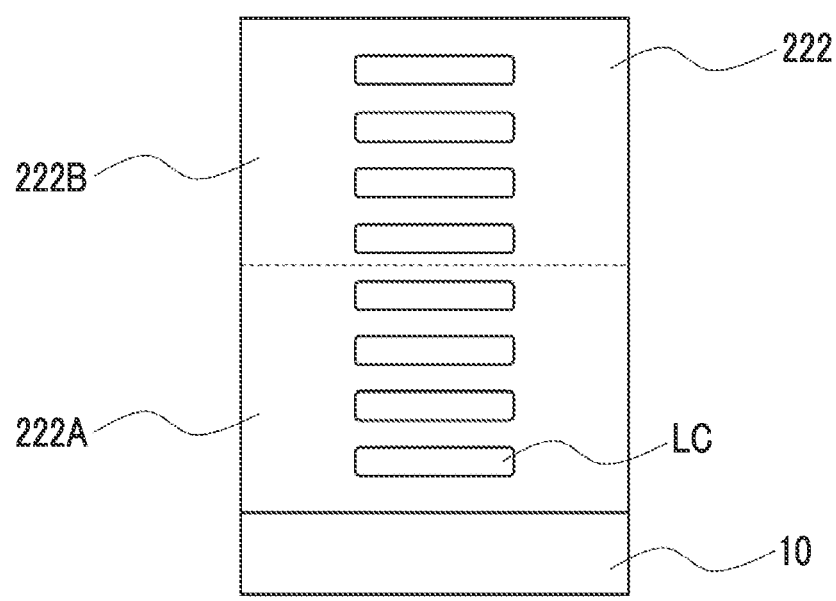
FIG. 8 is a cross-sectional view of a composition layer for explaining an example of a step 3B of a method for producing the optically anisotropic layer that satisfies Requirement 2.
Figure 8:

The step 2B is a step of subjecting the composition layer to a heat treatment to align the liquid crystal compound in the composition layer. Carrying out this step brings the liquid crystal compound in the composition layer into a predetermined alignment state. As shown in FIG. 8 which will be described later, for example, the liquid crystal compound is homogeneously aligned in the composition by carrying out the step 2B.

With regard to heat treatment conditions, the optimum conditions are selected according to the liquid crystal compound used.

Above all, the heating temperature is often 25° C. to 250° C., more often 40° C. to 150° C., and still more often 50° C. to 130° C.

The heating time is often 0.1 to 60 minutes and more often 0.2 to 5 minutes.

<Step 3B>

The step 3B is a step of irradiating the composition layer with light for 50 seconds or less and at an irradiation amount of 300 mJ/cm$^2$ or less under the condition that the oxygen concentration is 1% by volume or more, after the step 2B. In the following, the mechanism of this step will be described with reference to the accompanying drawings. In the following, a case where the composition layer contains a compound that is hydrophilized upon irradiation with light will be described as an example. In FIG. 8, the liquid crystal compound LC is homogeneously aligned in the composition layer.

As shown in FIG. 8, in the step 3B, light irradiation is carried out from the direction opposite to a composition layer 222 side of the substrate 10 (the direction of the white arrow in FIG. 8) under the condition that the oxygen concentration is 1% by volume or more. Although the light irradiation is carried out from the substrate 10 side in FIG. 8, the light irradiation may be carried out from the composition layer 222 side.

At that time, in a case where a lower region 222A of the composition layer 222 on the substrate 10 side and an upper region 222B of the composition layer 222 opposite to the substrate 10 side are compared, the surface of the upper region 222B is on the air side, so that the oxygen concentration in the upper region 222B is high and the oxygen concentration in the lower region 222A is low. Therefore, in a case where the composition layer 222 is irradiated with light, the polymerization of the liquid crystal compound easily proceeds in the lower region 222A, and the alignment state of the liquid crystal compound is fixed. It should be noted that the specific photosensitive compound is also present in the lower region 222A, so that the specific photosensitive compound is also photosensitized and therefore hydrophilization proceeds. However, since the alignment state of the liquid crystal compound is fixed in the lower region 222A, there is no change in the alignment state of the liquid crystal compound even in a case where the step 4B of subjecting the light-irradiated composition layer to a heat treatment, which will be described later, is carried out.

In addition, since the oxygen concentration is high in the upper region 222B, the polymerization of the liquid crystal compound is inhibited by oxygen and therefore the polymerization does not proceed easily even in a case where light irradiation is carried out. Further, the specific photosensitive compound is also present in the upper region 222B, so that the specific photosensitive compound is photosensitized and therefore hydrophilization proceeds. Therefore, in a case where the step 4B which will be described later is carried out, the alignment state of the liquid crystal compound changes under the influence of the changed polarity.

That is, the immobilization of the alignment state of the liquid crystal compound is likely to proceed in the substrate-side region (lower region) of the composition layer by carrying out the step 3B. In addition, in the region of the composition layer (upper region) opposite to the substrate side, the immobilization of the alignment state of the liquid crystal compound is difficult to proceed, and the polarity changes according to the photosensitized specific photosensitive compound.

Various conditions (oxygen concentration, irradiation time, irradiation amount, and the like) of light irradiation in the step 3B are the same as various conditions of light irradiation in the above-described step 3A.

<Step 4B>

The step 4B is a step of subjecting the composition layer to a heat treatment at a temperature higher than that upon irradiation with light, after the step 3B. Carrying out this step leads to a change in the alignment state of the liquid crystal compound in a region whose polarity has been changed due to the specific photosensitive compound in the composition layer that has been subjected to light irradiation. More specifically, this step is a step of subjecting the composition layer after the step 3B to a heat treatment at a temperature higher than that at the time of irradiation to align the liquid crystal compound in the composition layer not fixed in the step 3B.

In the following, the mechanism of this step will be described with reference to the accompanying drawings.

As described above, in a case where the step 3B is carried out on the composition layer 222 shown in FIG. 8, the alignment state of the liquid crystal compound is fixed in the lower region 222A, whereas the polymerization of the liquid crystal compound is difficult to proceed and the alignment state of the liquid crystal compound is not fixed in the upper region 222B. In addition, in the upper region 222B, the specific photosensitive compound is photosensitized and is hydrophilized. In a case where such a change in polarity occurs, the alignment direction of the liquid crystal compound is affected in the upper region 222B, as compared with the state before light irradiation. This point will be described in more detail. In the following, the case where the composition layer contains a specific photosensitive compound that is hydrophilized upon irradiation with light, as described above, will be described as an example.

Figure 9:
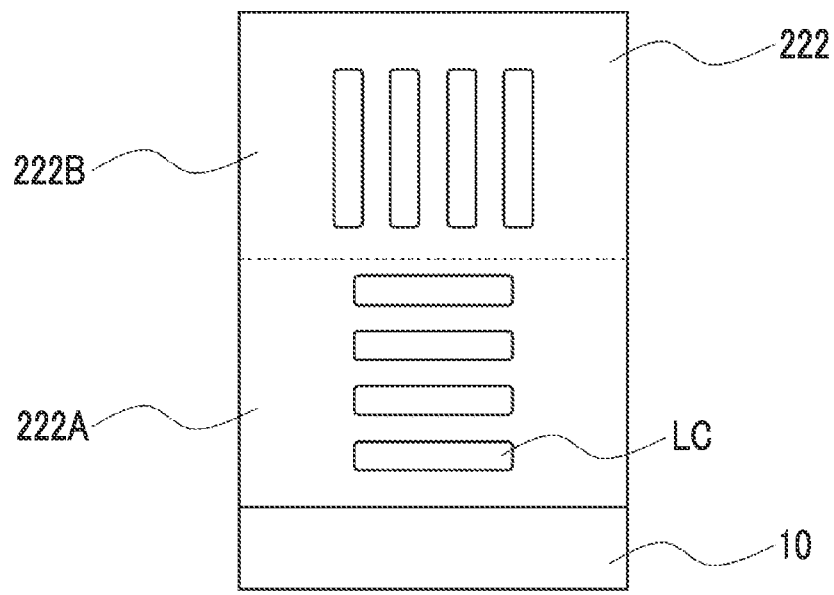
FIG. 9 is a cross-sectional view of a composition layer for explaining an example of a step 4B of the method for producing the optically anisotropic layer that satisfies Requirement 2.

In a case where the composition layer contains a specific photosensitive compound that is hydrophilized upon irradiation with light, the liquid crystal compound is homeotropically aligned in the upper region 222B, as shown in FIG. 9, in a case where the step 4B is carried out. In particular, in a case where the specific photosensitive compound is present in the vicinity of the surface of the composition layer, the liquid crystal compound is likely to be homeotropically aligned.

On the other hand, as described above, the polymerization of the liquid crystal compound proceeds to fix the alignment state of the liquid crystal compound during the step 3B in the lower region 222A of the composition layer 222, so that the realignment of the liquid crystal compound does not proceed.

As described above, carrying out the step 4B leads to the formation of a region containing a liquid crystal compound whose alignment direction is tilt-aligned or vertically aligned with respect to the surface of the layer.

As described above, the aspect in which the liquid crystal compound is homeotropically aligned has been described in FIG. 9, but the present invention is not limited to this aspect. For example, it may be an aspect in which the liquid crystal compound is tilt-aligned.

The heat treatment is carried out at a temperature higher than that at the time of light irradiation.

The difference between the temperature of the heat treatment and the temperature at the time of light irradiation is preferably 5° C. or more, more preferably 10° C. to 110° C., and still more preferably 20° C. to 110° C.

The temperature of the heat treatment is preferably a temperature which is higher than the temperature at the time of light irradiation and at which the non-fixed liquid crystal compound in the composition layer is aligned. More specifically, the temperature of the heat treatment is often 40° C. to 250° C., more often 50° C. to 150° C., still more often higher than 50° C. and lower than or equal to 150° C., and particularly often 60° C. to 130° C.

The heating time is often 0.01 to 60 minutes and more often 0.03 to 5 minutes.

<Step 5B>

The step 5B is a step of subjecting the composition layer to a curing treatment to form an optically anisotropic layer having a plurality of regions in which the alignment states of the liquid crystal compound are different along a thickness direction, after the step 4B. By carrying out this step, the alignment state of the liquid crystal compound in the composition layer is fixed, and as a result, a predetermined optically anisotropic layer is formed. Carrying out this step leads to the formation of an optically anisotropic layer having a plurality of regions having different tilt angles of the alignment direction of the liquid crystal compound with respect to the surface of the optically anisotropic layer, along a thickness direction. In particular, carrying out this step can lead to the formation of an optically anisotropic layer having, along a thickness direction, a region formed by fixing the alignment state of a liquid crystal compound homeotropically aligned or tilt-aligned and a region formed by fixing the alignment state of a liquid crystal compound homogeneously aligned.

Examples of the method of the curing treatment in the step 5B include the method of the curing treatment in the step 5A.

The thickness of the optically anisotropic layer that satisfies Requirement 2 is not particularly limited and is preferably 0.05 to 10 more preferably 0.1 to 8.0 and still more preferably 0.2 to 6.0

<<Requirement 3>>

The optically anisotropic layer satisfying Requirement 3 has a region formed by fixing an alignment state in which a liquid crystal compound is aligned and a region formed by fixing a state in which the liquid crystal compound exhibits an isotropic phase, along a thickness direction.

Figure 10:
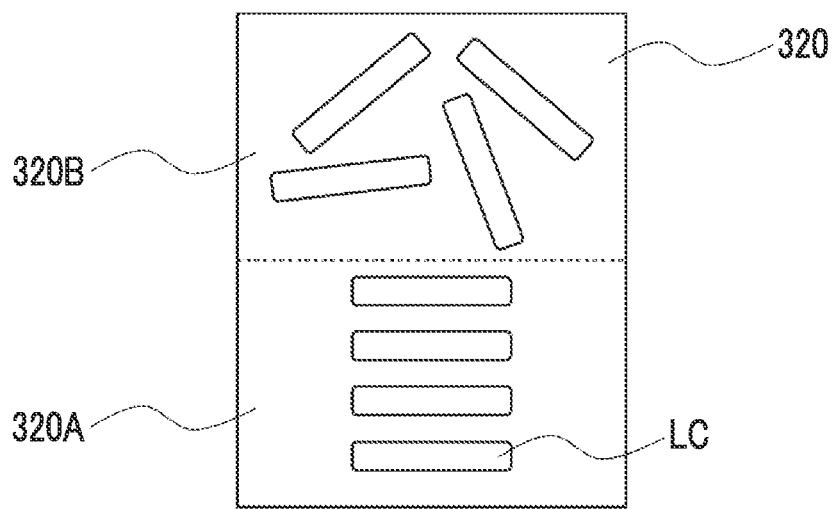
FIG. 10 is a cross-sectional view showing one embodiment of an optically anisotropic layer that satisfies Requirement 3.

FIG. 10 shows an embodiment of an optically anisotropic layer that satisfies Requirement 3.

An optically anisotropic layer 320 shown in FIG. 10 is an optically anisotropic layer formed by fixing the alignment state of a liquid crystal compound, and has a first region 320A and a second region 320B along a thickness direction. The first region 320A is a region formed by fixing the alignment state of a liquid crystal compound homogeneously aligned, and the second region 320B is a region formed by fixing the state in which the liquid crystal compound exhibits an isotropic phase.

In FIG. 10, the aspect of the optically anisotropic layer having, along a thickness direction, a region formed by fixing the alignment state of a liquid crystal compound homogeneously aligned and a region formed by fixing a state in which the liquid crystal compound exhibits an isotropic phase has been described, but the present invention is not limited to this aspect as long as it includes the region formed by fixing a state in which the liquid crystal compound exhibits an isotropic phase.

With regard to the alignment state of the liquid crystal compound, for example, in a case where the liquid crystal compound is a rod-like liquid crystal compound, the alignment state thereof includes, for example, nematic alignment (a state in which a nematic phase is formed), smectic alignment (a state in which a smectic phase is formed), cholesteric alignment (a state in which a cholesteric phase is formed), and hybrid alignment. In a case where the liquid crystal compound is a discotic liquid crystal compound, the alignment state thereof includes nematic alignment, columnar alignment (a state in which a columnar phase is formed), and cholesteric alignment.

More specifically, an optically anisotropic layer having, along a thickness direction, a region formed by fixing the alignment state of a liquid crystal compound homeotropically aligned and a region formed by fixing a state in which the liquid crystal compound exhibits an isotropic phase may be formed. In addition, an optically anisotropic layer having, along a thickness direction, a region formed by fixing a cholesteric liquid crystalline phase formed of a liquid crystal compound and a region formed by fixing a state in which the liquid crystal compound exhibits an isotropic phase may be formed.

The optical properties of the optically anisotropic layer satisfying Requirement 3 are not particularly limited, and it is preferable that the optically anisotropic layer functions as a $\lambda/4$ plate.

The $\lambda/4$ plate is a plate having a function of converting linearly polarized light having a certain specific wavelength into circularly polarized light (or converting circularly polarized light into linearly polarized light), and refers to a plate (optically anisotropic layer) in which an in-plane retardation $Re(\lambda)$ at a specific wavelength $\lambda$ nm satisfies $Re(\lambda)=\lambda/4$.

This expression may be achieved at any wavelength in a visible light range (for example, 550 nm), and the in-plane retardation Re(550) at a wavelength of 550 nm preferably satisfies a relationship of 110 nm≤Re(550)≤180 nm.

The method for producing the optically anisotropic layer that satisfies Requirement 3 is not particularly limited, and is preferably a production method having the following steps 1C to 5C.

Step 1C: a step of forming a composition layer containing a liquid crystal compound having a polymerizable group and a leveling agent Step 2C: a step of subjecting the composition layer to a heat treatment to align the liquid crystal compound in the composition layer Step 3C: a step of irradiating the composition layer with light for 50 seconds or less and at an irradiation amount of 300 mJ/cm$^2$ or less under the condition that the oxygen concentration is 1% by volume or more, after the step 2C Step 4C: a step of subjecting the composition layer to a heat treatment at a temperature higher than that at the time of light irradiation and equal to or higher than the temperature at which the liquid crystal compound is brought into an isotropic phase, after the step 3C Step 5C: a step of subjecting the composition layer to a curing treatment to form an optically anisotropic layer having a plurality of regions in which the alignment states of the liquid crystal compound are different along a thickness direction, after the step 4C Hereinafter, the procedure of each of the above-mentioned steps will be described in detail.

<Step 1C>

The step 1C is a step of forming a composition layer containing a liquid crystal compound having a polymerizable group and a leveling agent. Carrying out this step leads to the formation of a composition layer to be subjected to a light irradiation treatment which will be described later.

Definitions and contents of the liquid crystal compound and the leveling agent contained in the composition layer are as described in the step 1A.

In addition, the composition layer may contain components other than the liquid crystal compound, as described in the step 1A.

In the step 1A, a composition layer containing the above-mentioned components is formed, but the procedure is not particularly limited. For example, a method of applying a composition containing the above-mentioned liquid crystal compound having a polymerizable group and leveling agent onto a substrate, followed by a drying treatment if necessary (hereinafter, also simply referred to as "coating method"), and a method of separately forming a composition layer and transferring the formed layer onto a substrate can be mentioned. Above all, the coating method is preferable from the viewpoint of productivity.

Hereinafter, the coating method will be described in detail.

The composition used in the coating method contains the above-mentioned liquid crystal compound having a polymerizable group and other components used as necessary (for example, a polymerization initiator, a polymerizable monomer, a surfactant, and a polymer).

The content of each component in the composition is preferably adjusted to be the content of each component in the composition layer described above.

The coating method is not particularly limited, and examples thereof include a wire bar coating method, an extrusion coating method, a direct gravure coating method, a reverse gravure coating method, and a die-coating method.

If necessary, a treatment for drying the coating film applied onto the substrate may be carried out after application of the composition. The solvent can be removed from the coating film by carrying out the drying treatment.

The film thickness of the coating film is not particularly limited and is preferably 0.1 to 20 more preferably 0.2 to 15 and still more preferably 0.5 to 10 μm.

<Step 2C>

Figure 11:
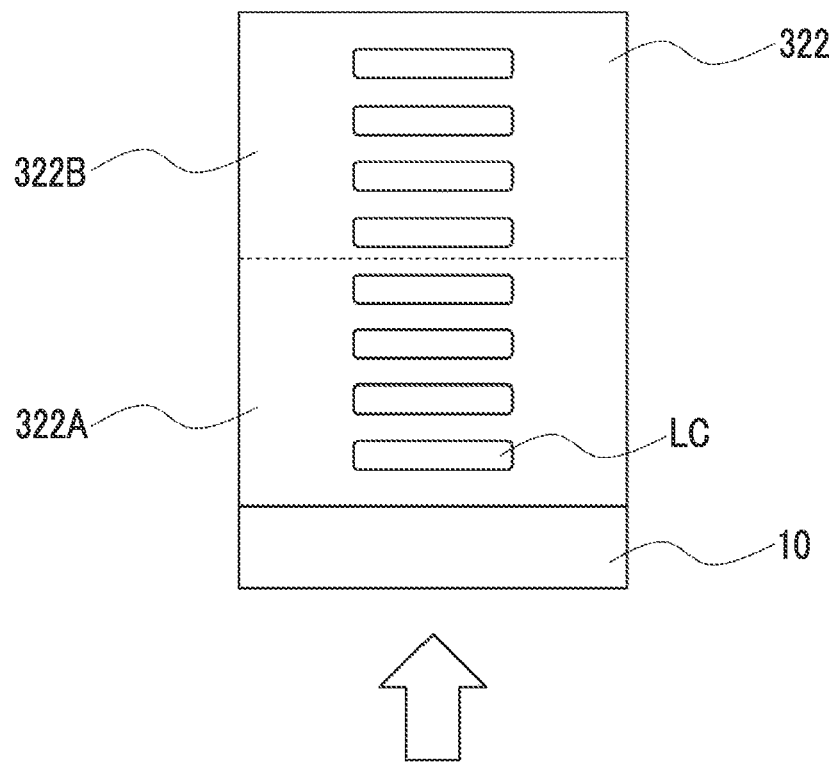
FIG. 11 is a cross-sectional view of a composition layer for explaining an example of a step 3C of a method for producing the optically anisotropic layer that satisfies Requirement 3.

The step 2C is a step of subjecting the composition layer to a heat treatment to align the liquid crystal compound in the composition layer. Carrying out this step brings the liquid crystal compound in the composition layer into a predetermined alignment state. As shown in FIG. 11 which will be described later, for example, the liquid crystal compound is homogeneously aligned in the composition by carrying out the step 2C.

With regard to heat treatment conditions, the optimum conditions are selected according to the liquid crystal compound used.

Above all, the heating temperature is often 25° C. to 250° C., more often 40° C. to 150° C., and still more often 50° C. to 130° C.

The heating time is often 0.1 to 60 minutes and more often 0.2 to 5 minutes.

<Step 3C>

The step 3C is a step of irradiating the composition layer with light for 50 seconds or less and at an irradiation amount of 300 mJ/cm$^2$ or less under the condition that the oxygen concentration is 1% by volume or more, after the step 2C. In the following, the mechanism of this step will be described with reference to the accompanying drawings. In FIG. 11, the liquid crystal compound LC is homogeneously aligned in the composition layer.

As shown in FIG. 11, in the step 3C, light irradiation is carried out from the direction opposite to a composition layer 322 side of the substrate 10 (the direction of the white arrow in FIG. 11) under the condition that the oxygen concentration is 1% by volume or more. Although the light irradiation is carried out from the substrate 10 side in FIG. 11, the light irradiation may be carried out from the composition layer 322 side.

At that time, in a case where a lower region 322A of the composition layer 322 on the substrate 10 side and an upper region 322B of the composition layer 322 opposite to the substrate 10 side are compared, the surface of the upper region 322B is on the air side, so that the oxygen concentration in the upper region 322B is high and the oxygen concentration in the lower region 322A is low. Therefore, in a case where the composition layer 322 is irradiated with light, the polymerization of the liquid crystal compound easily proceeds in the lower region 322A, and the alignment state of the liquid crystal compound is fixed. Therefore, there is no change in the alignment state of the liquid crystal compound even in a case where the step 4C of subjecting the light-irradiated composition layer to a heat treatment, which will be described later, is carried out.

In addition, since the oxygen concentration is high in the upper region 322B, the polymerization of the liquid crystal compound is inhibited by oxygen and therefore the polymerization does not proceed easily even in a case where light irradiation is carried out. Therefore, the alignment state of the liquid crystal compound changes in a case where the step 4C which will be described later is carried out.

That is, the immobilization of the alignment state of the liquid crystal compound is likely to proceed in the substrate-side region (lower region) of the composition layer by carrying out the step 3C. In addition, the immobilization of the alignment state of the liquid crystal compound is difficult to proceed in the region of the composition layer (upper region) opposite to the substrate side, and the alignment state of the liquid crystal compound is changed by the step 4D which will be described later.

Various conditions (oxygen concentration, irradiation time, irradiation amount, and the like) of light irradiation in the step 3C are the same as various conditions of light irradiation in the above-described step 3A.

<Step 4C>

The step 4C is a step of subjecting the composition layer to a heat treatment at a temperature higher than that at the time of light irradiation and equal to or higher than the temperature at which the liquid crystal compound is brought into an isotropic phase, after the step 3C. By carrying out this step, the liquid crystal compound exhibits an isotropic phase in the upper region in which the alignment state of the liquid crystal compound in the composition layer is not fixed.

In the following, the mechanism of this step will be described with reference to the accompanying drawings.

As described above, in a case where the step 3C is carried out on the composition layer 322 shown in FIG. 11, the alignment state of the liquid crystal compound is fixed in the lower region 322A, whereas the polymerization of the liquid crystal compound is difficult to proceed and the alignment state of the liquid crystal compound is not fixed in the upper region 322B.

Figure 12:
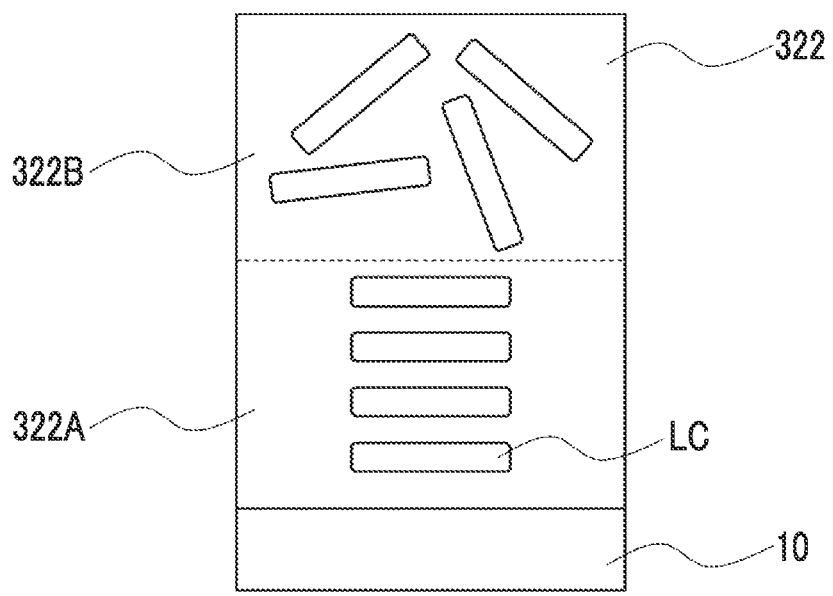
FIG. 12 is a cross-sectional view of a composition layer for explaining an example of a step 4C of the method for producing the optically anisotropic layer that satisfies Requirement 3.

Therefore, in a case where the step 4C is carried out, the polymerization of the liquid crystal compound does not proceed in the upper region 322B, so that the alignment state of the liquid crystal compound collapses and then the liquid crystal compound is brought into an isotropic phase, as shown in FIG. 12.

On the other hand, as described above, the polymerization of the liquid crystal compound proceeds to fix the alignment state of the liquid crystal compound during the step 3C in the lower region 322A of the composition layer 322, so that the realignment of the liquid crystal compound does not proceed.

As described above, carrying out the step 4C leads to the formation of an optically anisotropic layer having a region formed by fixing an alignment state (for example, a homogeneous alignment state) of a liquid crystal compound and a region formed by fixing a state in which the liquid crystal compound is not aligned (an isotropic phase of the liquid crystal compound), along a thickness direction.

The heat treatment is carried out at a temperature higher than that at the time of light irradiation and equal to or higher than the temperature at which the liquid crystal compound is brought into an isotropic phase.

The difference between the temperature of the heat treatment and the temperature at the time of light irradiation is preferably 5° C. or more, more preferably 10° C. to 110° C., and still more preferably 20° C. to 110° C.

The temperature of the heat treatment is preferably a temperature which is higher than the temperature at the time of light irradiation and which brings the non-fixed liquid crystal compound in the composition layer into an isotropic phase. More specifically, the temperature of the heat treatment is often 40° C. to 250° C., more often 50° C. to 150° C., still more often higher than 50° C. and lower than or equal to 150° C., and particularly often 60° C. to 130° C.

The heating time is often 0.01 to 60 minutes and more often 0.03 to 5 minutes.

<Step 5C>

The step 5C is a step of subjecting the composition layer to a curing treatment to form an optically anisotropic layer having a plurality of regions in which the alignment states of the liquid crystal compound are different along a thickness direction, after the step 4C. By carrying out this step, the alignment state of the liquid crystal compound in the composition layer is fixed, and as a result, a predetermined optically anisotropic layer is formed.

Examples of the method of the curing treatment in the step 5C include the method of the curing treatment in the step 5A.

The thickness of the optically anisotropic layer that satisfies Requirement 3 is not particularly limited and is preferably 0.05 to 10 more preferably 0.1 to 8.0 and still more preferably 0.2 to 6.0

<<Applications>>

The optically anisotropic layer can be combined with a variety of members.

For example, the optically anisotropic layer may be combined with another optically anisotropic layer. That is, a laminate 24 including a substrate 10, the above-mentioned optically anisotropic layer 12, and another optically anisotropic layer 22 may be prepared as shown in FIG. 13.

Figure 13:
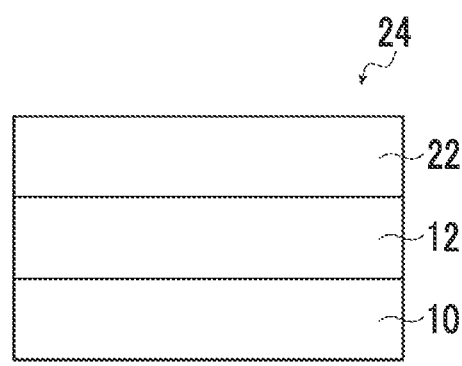
FIG. 13 is a cross-sectional view showing an embodiment of a laminate according to the present invention.

Although the laminate 24 shown in FIG. 13 includes the substrate 10, the laminate may not include the substrate.

The other optically anisotropic layer is not particularly limited, and examples thereof include A-plates (a positive A-plate and a negative A-plate) and C-plates (a positive C-plate and a negative C-plate). Above all, the C-plate is preferable from the viewpoint that it can be easily applied to various applications (for example, a circularly polarizing plate) which will be described later.

The range of the absolute value of the thickness direction retardation of the C-plate at a wavelength of 550 nm is not particularly limited and is preferably 5 to 300 nm and more preferably 10 to 200 nm.

In the present specification, the A-plate and the C-plate are defined as follows.

There are two types of A-plates, a positive A-plate (A-plate which is positive) and a negative A-plate (A-plate which is negative). The positive A-plate satisfies the relationship of Expression (A1) and the negative A-plate satisfies the relationship of Expression (A2) in a case where a refractive index in a film in-plane slow axis direction (in a direction in which an in-plane refractive index is maximum) is defined as nx, a refractive index in an in-plane direction orthogonal to the in-plane slow axis is defined as ny, and a refractive index in a thickness direction is defined as nz. It should be noted that the positive A-plate has an Rth showing a positive value and the negative A-plate has an Rth showing a negative value.

$$nx > ny \approx nz \qquad \text{Expression (A1)}$$

$$ny < nx \approx nz \qquad \text{Expression (A2)}$$

It should be noted that the symbol "≈" encompasses not only a case where the both sides are completely the same as each other but also a case where the both sides are substantially the same as each other. The expression "substantially the same" means that, for example, a case where (ny−nz)×d (in which d is a thickness of a film) is −10 to 10 nm and preferably −5 to 5 nm is also included in "ny≈nz"; and a case where (nx−nz)×d is −10 to 10 nm and preferably −5 to 5 nm is also included in "nx≈nz".

There are two types of C-plates, a positive C-plate (C-plate which is positive) and a negative C-plate (C-plate which is negative). The positive C-plate satisfies the relationship of Expression (C1) and the negative C-plate satisfies the relationship of Expression (C2). It should be noted that the positive C-plate has an Rth showing a negative value and the negative C-plate has an Rth showing a positive value.

$$nz > nx \approx ny \qquad \text{Expression (C1)}$$

$$nz < nx \approx ny \qquad \text{Expression (C2)}$$

It should be noted that the symbol "≈" encompasses not only a case where the both sides are completely the same as each other but also a case where the both sides are substantially the same as each other. The expression "substantially the same" means that, for example, a case where (nx−ny)×d (in which d is a thickness of a film) is 0 to 10 nm and preferably 0 to 5 nm is also included in "nx≈ny".

The method for producing the laminate is not particularly limited, and examples thereof include known methods. For example, there is a method of laminating an optically anisotropic layer obtained by the production method of the present invention and another optically anisotropic layer (for example, a C-plate) to obtain a laminate. As the method of laminating, another separately prepared optically anisotropic layer may be bonded onto the optically anisotropic layer obtained by the production method of the present invention, or a composition for forming another optically anisotropic layer may be applied onto the optically anisotropic layer obtained by the production method of the present invention to form another optically anisotropic layer.

Figure 14:
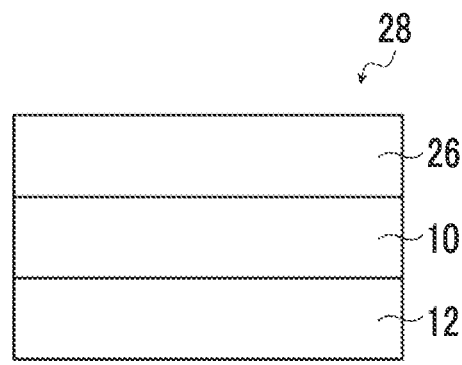
FIG. 14 is a cross-sectional view showing an embodiment of an optically anisotropic layer with a polarizer according to the present invention.

In addition, the optically anisotropic layer obtained by the production method of the present invention may be combined with a polarizer. That is, an optically anisotropic layer with a polarizer 28, which includes a substrate 10, the above-mentioned optically anisotropic layer 12, and a polarizer 26, may be prepared as shown in FIG. 14. In FIG. 14, the polarizer 26 is disposed on the substrate 10, but the present invention is not limited to this aspect and the polarizer 26 may be disposed on the optically anisotropic layer 12.

In addition, although the optically anisotropic layer with a polarizer 28 shown in FIG. 14 includes the substrate 10, the substrate may not be included in the optically anisotropic layer with a polarizer.

The polarizer may be a member having a function of converting natural light into specific linearly polarized light, and examples thereof include an absorption type polarizer.

The type of the polarizer is not particularly limited, and a commonly used polarizer can be used. Examples of the polarizer include an iodine-based polarizer, a dye-based polarizer using a dichroic dye, and a polyene-based polarizer. The iodine-based polarizer and the dye-based polarizer are generally prepared by adsorbing iodine or a dichroic dye on a polyvinyl alcohol, followed by stretching.

A protective film may be disposed on one side or both sides of the polarizer.

The method for producing the optically anisotropic layer with a polarizer is not particularly limited, and a known method can be mentioned. For example, there is a method of laminating an optically anisotropic layer obtained by the production method of the present invention and a polarizer to obtain an optically anisotropic layer with a polarizer.

Although the aspect in which an optically anisotropic layer and a polarizer are laminated has been described above, the above-mentioned laminate and a polarizer may be laminated to produce a laminate with a polarizer in the present invention.

The optically anisotropic layer can be applied to various applications. For example, the optically anisotropic layer can be suitably applied to a circularly polarizing plate, and the above-mentioned optically anisotropic layer with a polarizer can also be used as a circularly polarizing plate.

The circularly polarizing plate having the above-described configuration can be suitably used for antireflection applications of an image display apparatus such as a liquid crystal display device (LCD), a plasma display panel (PDP), an electroluminescent display (ELD), or a cathode tube display device (CRT) to improve a contrast ratio of display light.

For example, mention may be made of an aspect in which the circularly polarizing plate of the present invention is used on a light extraction surface side of an organic EL display device. In this case, the external light is linearly polarized by a polarizing film and then passes through the optically anisotropic layer to convert into circularly polarized light. In a case where this circularly polarized light is reflected by a metal electrode, the circularly polarized state is reversed, and in a case where the circularly polarized light in the reversed state passes through the optically anisotropic layer again, the passed light converts into linearly polarized light tilted by 90° from the time of incidence, reaches the polarizing film, and is absorbed. As a result, the influence of external light can be suppressed.

Above all, the above-mentioned optically anisotropic layer with a polarizer or the above-mentioned laminate with a polarizer is preferably applied to an organic EL display device. That is, it is preferable that the optically anisotropic layer with a polarizer or the laminate with a polarizer is disposed on an organic EL panel of the organic EL display device and applied for antireflection applications.

The organic EL panel is a member in which a light emitting layer or a plurality of organic compound thin films including a light emitting layer are formed between a pair of electrodes of an anode and a cathode, and may have a hole injection layer, a hole transport layer, an electron injection layer, an electron transport layer, a protective layer, and the like in which each of these layers may have other functions, in addition to the light emitting layer. Various materials can be used to form each layer.

An optically anisotropic layer can be suitably applied to an optical compensation plate of a liquid crystal display device, and therefore the optically anisotropic layer with a polarizer can also be used as an optical compensation plate of a liquid crystal display device.

The liquid crystal cell used in the liquid crystal display device is preferably in a vertical alignment (VA) mode, an optically compensated bend (OCB) mode, an in-plane-switching (IPS) mode, a fringe-field-switching (FFS) mode, or a twisted nematic (TN) mode, but the present invention is not limited thereto.

In a case where the optically anisotropic layer with a polarizer is used as an optical compensation plate of an IPS mode or FFS mode liquid crystal display device, the optically anisotropic layer preferably has a region formed by fixing the alignment state of a liquid crystal compound homogeneously aligned (horizontally aligned) and a region formed by fixing the alignment state of a liquid crystal compound homeotropically aligned (vertically aligned), as in the aspect shown in FIG. 7. In this case, it is preferable that the angle formed by an in-plane slow axis of the region formed by fixing the alignment state of a liquid crystal compound homogeneously aligned (horizontally aligned) and an absorption axis of the polarizer is orthogonal or parallel and specifically, it is more preferable that the angle formed by the in-plane slow axis of the region formed by fixing the alignment state of a liquid crystal compound homogeneously aligned (horizontally aligned) and the absorption axis of the polarizer is 0° to 5° or 85° to 95°.

Here, the "in-plane slow axis" of the region formed by fixing the alignment state of a liquid crystal compound homogeneously aligned (horizontally aligned) means the direction in which the refractive index is maximum in the plane of the region formed by fixing the alignment state of a liquid crystal compound homogeneously aligned (horizontally aligned), and the "absorption axis" of the polarizer means the direction in which the absorbance is highest.

In addition, in a case where the optically anisotropic layer with a polarizer is used as an optical compensation plate of an IPS mode or FFS mode liquid crystal display device, it is preferable that a polarizer, a region formed by fixing the alignment state of a liquid crystal compound homeotropically aligned (vertically aligned), a region formed by fixing the alignment state of a liquid crystal compound homogeneously aligned (horizontally aligned), and a liquid crystal cell are arranged in this order, or a polarizer, a region formed by fixing the alignment state of a liquid crystal compound homogeneously aligned (horizontally aligned), a region formed by fixing the alignment state of a liquid crystal compound homeotropically aligned (vertically aligned), and a liquid crystal cell are arranged in this order.

EXAMPLES

Hereinafter, features of the present invention will be described in more detail with reference to Examples and Comparative Examples. The materials, amounts used, proportions, treatment details, treatment procedure, and the like shown in the following Examples can be appropriately changed without departing from the spirit and scope of the present invention. Accordingly, the scope of the present invention should not be construed as being limited by the specific examples given below.

Example 1

(Preparation of Cellulose Acylate Film (Substrate))

The following composition was put into a mixing tank, stirred, and further heated at 90° C. for 10 minutes. Then, the obtained composition was filtered through a filter paper having an average pore diameter of 34 µm and a sintered metal filter having an average pore diameter of 10 µm to prepare a dope. The concentration of solid contents of the dope is 23.5% by mass, the amount of the plasticizer added is a proportion relative to cellulose acylate, and the solvent of the dope is methylene chloride/methanol/butanol=81/18/1 (in terms of a mass ratio).

| Cellulose acylate dope | |
|---|---|
| Cellulose acylate (acetyl substitution degree: 2.86, viscosity average polymerization degree: 310) | 100 parts by mass |
| Sugar ester compound 1 (represented by Chemical Formula (S4)) | 6.0 parts by mass |
| Sugar ester compound 2 (represented by Chemical Formula (S5)) | 2.0 parts by mass |
| Silica particle dispersion(AEROSIL R972, manufactured by Nippon Aerosil Co., Ltd.) | 0.1 parts by mass |
| Solvent (methylene chloride/methanol/butanol) | |

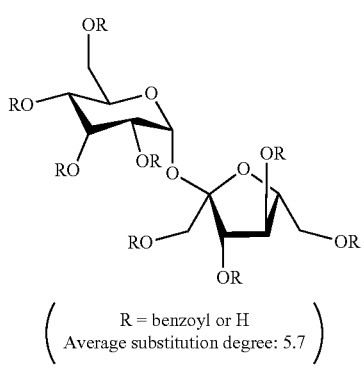

(S4)

(R = benzoyl or H
Average substitution degree: 5.7)

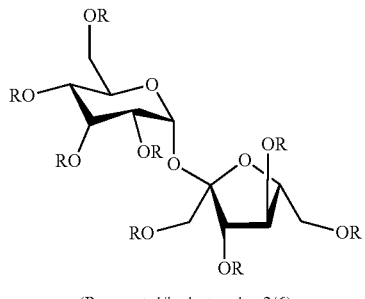

(S5)

(R = acetyl/isobutyryl = 2/6)

The dope prepared above was cast using a drum film forming machine. The dope was cast from a die such that it was in contact with a metal support cooled to 0° C., and then the obtained web (film) was stripped off. The drum was made of SUS.

The web (film) obtained by casting was peeled off from the drum and then dried in a tenter device for 20 minutes at 30° C. to 40° C. during film transport, using the tenter device that clips both ends of the web with clips to transport the film. Subsequently, the web was post-dried by zone heating while being rolled and transported. The obtained web was knurled and then wound up.

The obtained cellulose acylate film had a film thickness of 40 µm, an in-plane retardation Re(550) of 1 nm at a wavelength of 550 nm, and a thickness direction retardation Rth(550) of 26 nm at a wavelength of 550 nm.

(Alkali Saponification Treatment)

After passing the above-mentioned cellulose acylate film through a dielectric heating roll at a temperature of 60° C. to raise the film surface temperature to 40° C., an alkaline solution having the composition shown below was applied onto a band surface of the film using a bar coater at a coating amount of 14 ml/m$^2$, followed by heating to 110° C., and transportation under a steam type far-infrared heater manufactured by Noritake Co., Limited for 10 seconds. Subsequently, pure water was applied at 3 ml/m$^2$ using the same bar coater. Then, after repeating washing with water with a fountain coater and draining with an air knife three times, the film was transported to a drying zone at 70° C. for 10 seconds and dried to prepare a cellulose acylate film subjected to an alkali saponification treatment.

| Alkaline solution | |
|---|---|
| Potassium hydroxide | 4.7 parts by mass |
| Water | 15.8 parts by mass |
| Isopropanol | 63.7 parts by mass |
| Surfactant: $C_{14}H_{29}O(CH_2CH_2O)_{20}H$ | 1.0 parts by mass |
| Propylene glycol | 14.8 parts by mass |

(Formation of Alignment Film)

An alignment film coating liquid having the following composition was continuously applied onto the surface of the cellulose acylate film that had been subjected to the alkali saponification treatment with a #14 wire bar. The film was dried with hot air at 60° C. for 60 seconds and further with hot air at 100° C. for 120 seconds.

| Alignment film coating liquid | |
|---|---|
| Modified polyvinyl alcohol given below | 28 parts by mass |
| Citric acid ester (AS3, manufactured by Sankyo Kagaku Yakuhin Co., Ltd.) | 1.2 parts by mass |
| Photopolymerization initiator (Irgacure 2959, manufactured by BASF SE) | 0.84 parts by mass |
| Glutaraldehyde | 2.8 parts by mass |
| Water | 699 parts by mass |
| Methanol | 226 parts by mass |

(Modified Polyvinyl Alcohol)

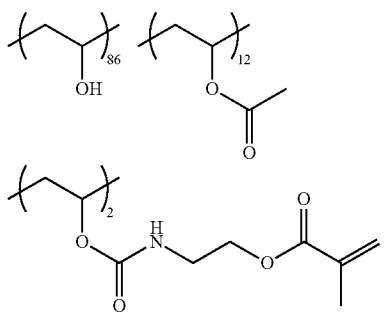

(Formation of Optically Anisotropic Layer)

The alignment film prepared above was continuously subjected to a rubbing treatment. At this time, the longitudinal direction and the transport direction of the elongated film were parallel, and the angle between the film longitudinal direction (transport direction) and the rubbing roller rotation axis was 45°. In a case where the film longitudinal direction (transport direction) is 90° and the clockwise direction is represented by a positive value with reference to a film width direction as a reference (0°) in a case of being observed from the film side, the rotation axis of the rubbing roller is at 135°. In other words, the position of the rotation axis of the rubbing roller is a position rotated by 45° counterclockwise with reference to the longitudinal direction of the film.

Using the rubbing-treated cellulose acylate film with an alignment film as a substrate, a composition (1) for forming an optically anisotropic layer containing a rod-like liquid crystal compound having the following composition was applied using a geeser coating machine to form a composition layer (corresponding to the step 1B).

Next, the obtained composition layer was heated at 120° C. for 80 seconds (corresponding to the step 2B). This heating resulted in alignment of the rod-like liquid crystal compound of the composition layer in a predetermined direction.

Then, the composition layer was irradiated (irradiation amount: 30 mJ/cm$^2$) with ultraviolet rays for 5 seconds using a 365 nm LED lamp (manufactured by AcroEdge Co., Ltd.) at 40° C. under oxygen-containing air (oxygen concentration: about 20% by volume) (corresponding to the step 3B).

Subsequently, the obtained composition layer was heated at 90° C. for 10 seconds (corresponding to the step 4B).

This was followed by nitrogen purging, and then the composition layer was irradiated (irradiation amount: 500 mJ/cm$^2$) with ultraviolet rays using a metal halide lamp (manufactured by Eye Graphics Co., Ltd.) at 55° C. with an oxygen concentration of 100 ppm by volume to form an optically anisotropic layer in which the alignment state of the liquid crystal compound was fixed (corresponding to the step 5B). An optical film (F-1) was prepared in this manner.

| Composition (1) for forming optically anisotropic layer | |
|---|---|
| Rod-like liquid crystal compound (A) given below | 20 parts by mass |
| Rod-like liquid crystal compound (D) given below | 40 parts by mass |
| Rod-like liquid crystal compound (E) given below | 40 parts by mass |
| Ethylene oxide-modified trimethylolpropane triacrylate (V# 360, manufactured by Osaka Organic Chemical Industry Ltd.) | 4 parts by mass |
| Photopolymerization initiator (Irgacure 819, manufactured by BASF SE) | 3 parts by mass |
| Polymer (A) given below | 0.08 parts by mass |
| Polymer (B) given below | 0.5 parts by mass |
| Photosensitive compound (A) given below | 0.4 parts by mass |
| Ionic compound (A) given below | 3.0 parts by mass |
| Methyl ethyl ketone | 156 parts by mass |

Rod-Like Liquid Crystal Compound (A) (Hereinafter, a Mixture of Compounds)

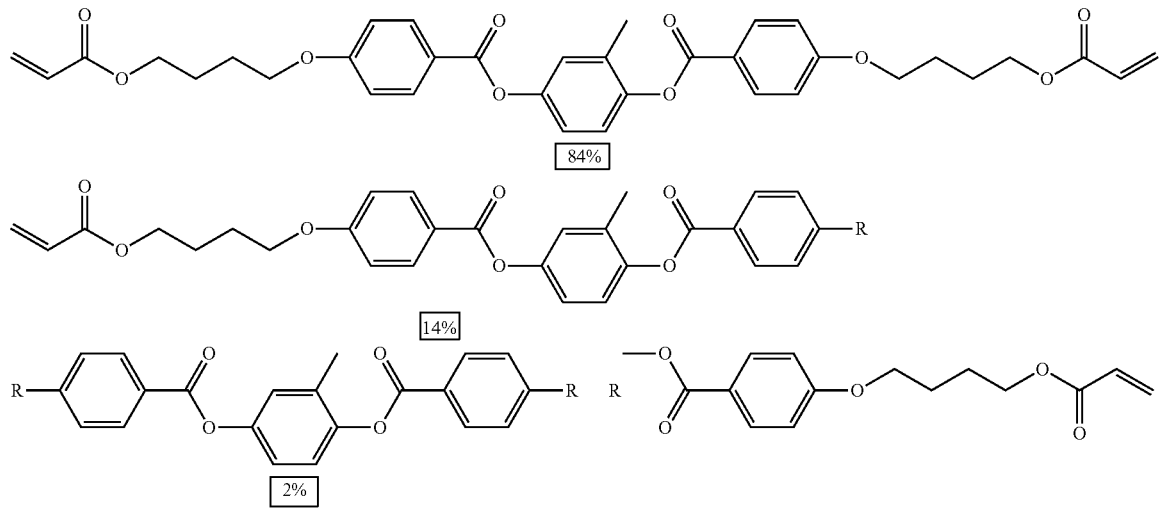

Rod-Like Liquid Crystal Compound (D)

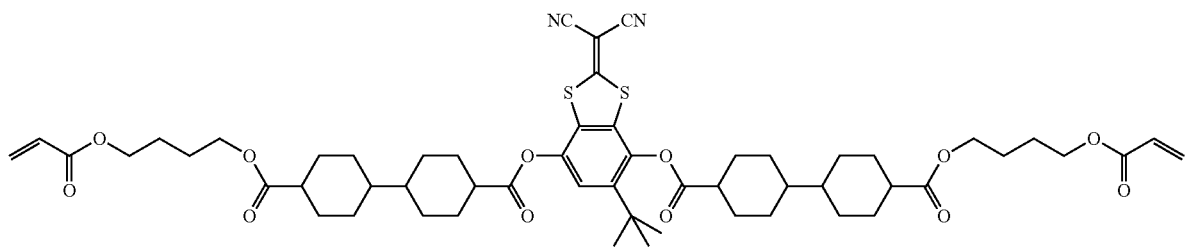 [SMILES: C=CC(=O)OCCCCOC(=O)C1CCC(C2CCC(C(=O)Oc3cc(C(C)(C)C)c(OC(=O)C4CCC(C5CCC(C(=O)OCCCCOC(=O)C=C)CC5)CC4)c4c3SC(=C(C#N)C#N)S4)CC2)CC1]

Rod-Like Liquid Crystal Compound (E)

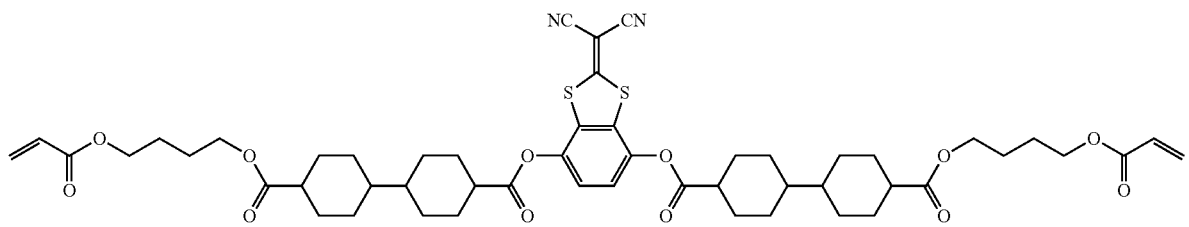 [SMILES: C=CC(=O)OCCCCOC(=O)C1CCC(C2CCC(C(=O)Oc3ccc(OC(=O)C4CCC(C5CCC(C(=O)OCCCCOC(=O)C=C)CC5)CC4)c4c3SC(=C(C#N)C#N)S4)CC2)CC1]

Polymer (A) (In the formulae, the numerical value described in each repeating unit represents the content (% by mass) of each repeating unit with respect to all the repeating units. Weight-average molecular weight: 15,000)

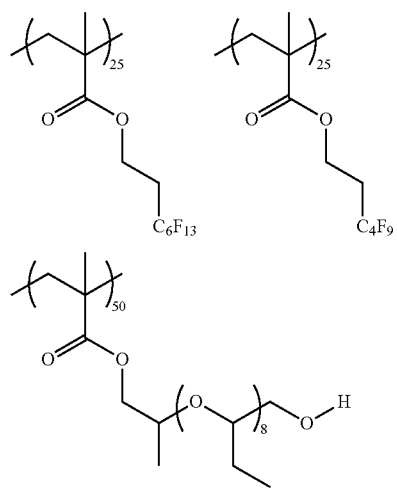

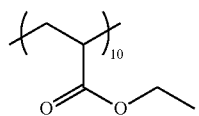

Polymer (B) (In the formulae, the numerical value described in each repeating unit represents the content (% by mass) of each repeating unit with respect to all the repeating units).

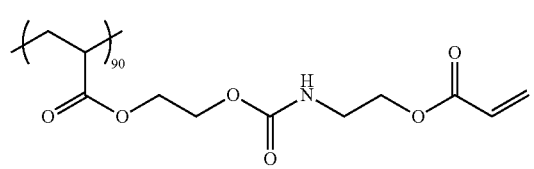

Photosensitive Compound (A)

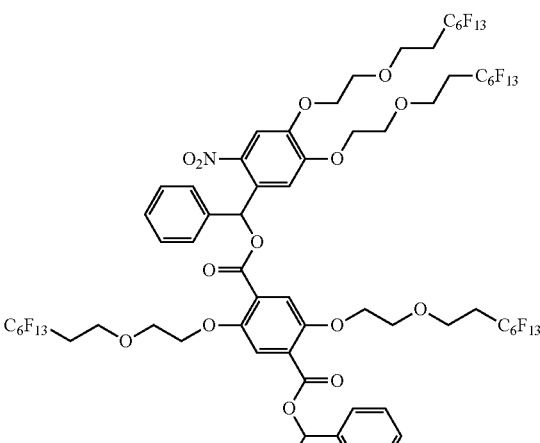

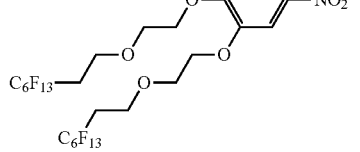

Ionic Compound (A)

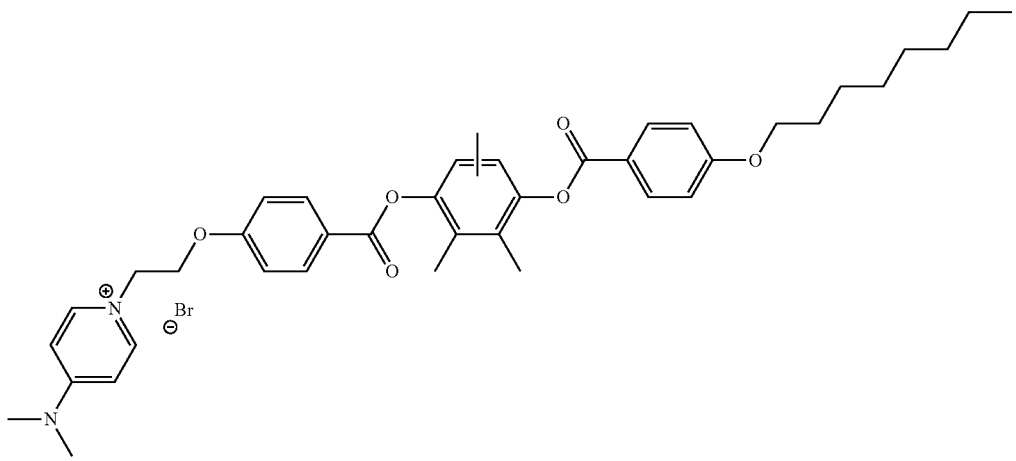

In a case where the photosensitive compound (A) in the composition (1) for forming an optically anisotropic layer was irradiated with light of 365 nm (30 mJ/cm$^2$), a decomposition product (A) having a hydrophilic carboxyl group was produced.

Decomposition Product (A)

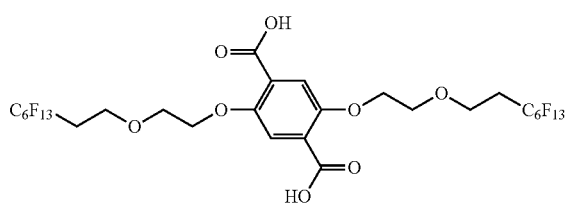

The optical film (F-1) prepared above was cut in parallel with the rubbing direction, and the optically anisotropic layer was observed from the cross-sectional direction with a polarization microscope. The thickness of the optically anisotropic layer was 4.3 the region having a thickness of 3.0 μm on the substrate side of the optically anisotropic layer (first region) had homogeneous alignment of the liquid crystal compound, and the region having a thickness of 1.3 μm on the air side of the optically anisotropic layer (side opposite to the substrate) (second region) had homeotropic alignment of the liquid crystal compound.

The optical properties of the optical film (F-1) were determined using Axoscan of Axometrics, Inc. and analysis software (Multi-Layer Analysis) of Axometrics, Inc. The first region had an in-plane retardation ($\Delta$n1d1) of 140 nm at a wavelength of 550 nm, and an angle of an in-plane slow axis of −45° with respect to the longitudinal direction of the film. In addition, the second region had an in-plane retardation ($\Delta$n2d2) of 0 nm at a wavelength of 550 nm and a thickness direction retardation of −60 nm at a wavelength of 550 nm.

The angle of the in-plane slow axis is expressed as negative in a case where it is clockwise (right-handed turning) and positive in a case where it is counterclockwise (left-handed turning) with the longitudinal direction of the film as a reference of 0°, upon observing the substrate from the surface side of the optically anisotropic layer.

Comparative Example 1

Using the rubbing-treated cellulose acylate film with an alignment film as a substrate, a composition (C1-1) for forming an optically anisotropic layer containing a rod-like liquid crystal compound having the following composition was applied using a geeser coating machine to form a composition layer.

Next, the obtained composition layer was heated at 120° C. for 80 seconds. This heating resulted in alignment of the rod-like liquid crystal compound of the composition layer in a predetermined direction.

This was followed by nitrogen purging, and then the composition layer was irradiated (irradiation amount: 200 mJ/cm$^2$) with ultraviolet rays using a metal halide lamp (manufactured by Eye Graphics Co., Ltd.) at 80° C. with an oxygen concentration of 100 ppm by volume to form an optically anisotropic layer in which the alignment state of the liquid crystal compound was fixed.

Then, a composition (C1-2) for forming an optically anisotropic layer containing a rod-like liquid crystal compound was applied onto the optically anisotropic layer using a geeser coating machine to form a composition layer.

Next, the obtained composition layer was heated at 80° C. for 60 seconds. This heating resulted in alignment of the rod-like liquid crystal compound of the composition layer in a predetermined direction.

This was followed by nitrogen purging, and then the composition layer was irradiated (irradiation amount: 500 mJ/cm$^2$) with ultraviolet rays using a metal halide lamp (manufactured by Eye Graphics Co., Ltd.) at 80° C. with an oxygen concentration of 100 ppm by volume to form an optically anisotropic layer in which the alignment state of the liquid crystal compound was fixed.

An optical film (C-1) was prepared in this manner.

| Composition (C1-1) for forming optically anisotropic layer | |
|---|---|
| Rod-like liquid crystal compound (A) given above | 20 parts by mass |
| Rod-like liquid crystal compound (D) given above | 40 parts by mass |
| Rod-like liquid crystal compound (E) given above | 40 parts by mass |

53
-continued

| Composition (C1-1) for forming optically anisotropic layer | |
|---|---|
| Ethylene oxide-modified trimethylolpropane triacrylate (V# 360, manufactured by Osaka Organic Chemical Industry Ltd.) | 4 parts by mass |
| Photopolymerization initiator (Irgacure 819, manufactured by BASF SE) | 3 parts by mass |
| Polymer (A) given above | 0.011 parts by mass |
| Polymer (B) given above | 0.7 parts by mass |
| Methyl ethyl ketone | 156 parts by mass |

| Composition (C1-2) for forming optically anisotropic layer | |
|---|---|
| Rod-like liquid crystal compound (A) given above | 20 parts by mass |
| Rod-like liquid crystal compound (D) given above | 40 parts by mass |
| Rod-like liquid crystal compound (E) given above | 40 parts by mass |
| Ethylene oxide-modified trimethylolpropane triacrylate (V# 360, manufactured by Osaka Organic Chemical Industry Ltd.) | 4 parts by mass |
| Photopolymerization initiator (Irgacure 819, manufactured by BASF SE) | 3 parts by mass |
| Polymer (A) given above | 0.11 parts by mass |
| Polymer (C) given below | 0.15 parts by mass |
| Ionic compound (A) given above | 3.0 parts by mass |
| Methyl ethyl ketone | 156 parts by mass |

Polymer (C) (In the formulae, the numerical value described in each repeating unit represents the content (% by mass) of each repeating unit with respect to all the repeating units).

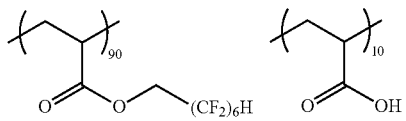

Comparative Example 2

An optical film (C-2) was prepared according to the same procedure as in Comparative Example 1, except that the following composition (C-2) for forming an optically anisotropic layer was used instead of the composition (C1-1) for forming an optically anisotropic layer.

| Composition (C-2) for forming optically anisotropic layer | |
|---|---|
| Rod-like liquid crystal compound (A) given above | 20 parts by mass |
| Rod-like liquid crystal compound (D) given above | 40 parts by mass |
| Rod-like liquid crystal compound (E) given above | 40 parts by mass |
| Ethylene oxide-modified trimethylolpropane triacrylate (V# 360, manufactured by Osaka Organic Chemical Industry Ltd.) | 4 parts by mass |
| Photopolymerization initiator (Irgacure 819, manufactured by BASF SE) | 3 parts by mass |
| Polymer (B) given above | 0.7 parts by mass |
| Polymer (A) given above | 0.0011 parts by mass |
| Methyl ethyl ketone | 156 parts by mass |

54
Comparative Example 3

An optical film (C-3) was prepared according to the same procedure as in Comparative Example 1, except that the following composition (C-3) for forming an optically anisotropic layer was used instead of the composition (C1-1) for forming an optically anisotropic layer.

| Composition (C-3) for forming optically anisotropic layer | |
|---|---|
| Rod-like liquid crystal compound (A) given above | 20 parts by mass |
| Rod-like liquid crystal compound (D) given above | 40 parts by mass |
| Rod-like liquid crystal compound (E) given above | 40 parts by mass |
| Ethylene oxide-modified trimethylolpropane triacrylate (V# 360, manufactured by Osaka Organic Chemical Industry Ltd.) | 4 parts by mass |
| Photopolymerization initiator (Irgacure 819, manufactured by BASF SE) | 3 parts by mass |
| Polymer (B) given above | 0.7 parts by mass |
| Polymer (A) given above | 0.0003 parts by mass |
| Methyl ethyl ketone | 156 parts by mass |

The optical films (C-1) to (C-3) prepared above were cut in parallel with the rubbing direction, and the optically anisotropic layer was observed from the cross-sectional direction with a polarization microscope. The thickness of the optically anisotropic layer was 4.3 the region having a thickness of 3.0 μm on the substrate side of the optically anisotropic layer (first region) had homogeneous alignment of the liquid crystal compound, and the region having a thickness of 1.3 μm on the air side of the optically anisotropic layer (side opposite to the substrate) (second region) had homeotropic alignment of the liquid crystal compound.

The optical properties of the optical films (C-1) to (C-3) were determined using Axoscan of Axometrics, Inc. and analysis software (Multi-Layer Analysis) of Axometrics, Inc. The first region had an in-plane retardation (Δn1d1) of 140 nm at a wavelength of 550 nm, and an in-plane slow axis of −45° with respect to the longitudinal direction of the film. In addition, the second region had an in-plane retardation (Δn2d2) of 0 nm at a wavelength of 550 nm and a thickness direction retardation of −60 nm at a wavelength of 550 nm.

The angle of the in-plane slow axis is expressed as negative in a case where it is clockwise (right-handed turning) and positive in a case where it is counterclockwise (left-handed turning) with the longitudinal direction of the film as a reference of 0°, upon observing the substrate from the surface side of the optically anisotropic layer.

In addition, regarding the optically anisotropic layers of Examples and Comparative Examples, as described above, while cutting the film in the depth direction of the optically anisotropic layer with an Ar⁺ cluster gun, the components in a depth direction were analyzed by a time-of-flight secondary ion mass spectrometer (TOF-SIMS) ("SIMS5" manufactured by IONTOF GmbH).

In the optically anisotropic layers of Examples, the profile as shown in FIG. 1 was obtained, and no secondary ion intensity derived from the leveling agent of 1/500 or more of the first intensity was observed at any depth of the region between the first position and the second position.

In the column of "Secondary ion intensity" in the table which will be given later, the case where the secondary ion intensity derived from the leveling agent of 1/500 or more of the first intensity was not observed at any depth of the region between the first position and the second position is expressed as "A", and the case where such a secondary ion intensity was observed is expressed as "B".

In Example 1, only the secondary ion intensity derived from the leveling agent of 1/1000 or less of the first intensity was observed at any depth of the region between the first position and the second position. In addition, in Comparative Examples 1 to 3, the maximum values of the secondary ion intensity derived from the leveling agent observed in the region between the first position and the second position were 1/12, 1/120, and 1/400 of the first intensity, respectively.

<Evaluation of Peelability>

In a case where a cross-cut 100 squares test was carried out on the optically anisotropic layer of the obtained optical film and CELLOTAPE (registered trademark: No. 405, manufactured by Nichiban Co., Ltd.) peeling was carried out five times, the number of squares from which more than half of the area was peeled off was counted and evaluated according to the following standards. For the marking depth of the cross-cut, the cross section was observed with an optical microscope. A notch was formed at a depth of ¾ or more in the film thickness direction of the optically anisotropic layer, and marking was carried out by applying pressure to a marking blade such that the notch did not reach the substrate.

The evaluation grade of A is preferable in terms of practical use.
A: The number of peeled squares is 0 or more and less than 10
B: The number of peeled squares is 10 or more and less than 30
C: The number of peeled squares is 30 or more and less than 50
D: The number of peeled squares is 50 or more

TABLE 1

| | Optical film | Secondary ion intensity | Peelability |
|---|---|---|---|
| Example 1 | F-1 | A | A |
| Comparative Example 1 | C-1 | B | D |
| Comparative Example 2 | C-2 | B | C |
| Comparative Example 3 | C-3 | B | B |

As shown in the above table, the desired effect was obtained in the optically anisotropic layer according to the embodiment of the present invention.

On the other hand, in Comparative Examples, the peeling of the squares occurred, and as a result of observing the peeling position of the peeled square with an optical microscope in cross section, the peeling occurred inside the optically anisotropic layer.

Example 2

(Formation of Optically Anisotropic Layer)

The cellulose acylate film prepared in Example 1 was continuously subjected to a rubbing treatment. At this time, the longitudinal direction and the transport direction of the elongated film were parallel to each other, and the angle formed by the longitudinal direction (transport direction) of the film and the rotation axis of the rubbing roller was 45°. The rotation axis of the rubbing roller was 135° in a case where the longitudinal direction (transport direction) of the film was defined as 90°, and the counterclockwise direction was represented by a positive value with reference to the width direction of the cellulose acylate film (0°), upon observing the film from the cellulose acylate film side. In other words, the position of the rotation axis of the rubbing roller was a position rotated by 45° clockwise with reference to the longitudinal direction of the cellulose acylate film.

Using the rubbing-treated cellulose acylate film as a substrate, a composition (2) for forming an optically anisotropic layer containing a rod-like liquid crystal compound having the following composition was applied using a geeser coating machine to form a composition layer (corresponding to the step 1C).

Next, the obtained composition layer was heated at 80° C. for 60 seconds (corresponding to the step 2C). This heating resulted in alignment of the rod-like liquid crystal compound of the composition layer in a predetermined direction.

Then, the composition layer was irradiated (irradiation amount: 50 mJ/cm$^2$) with ultraviolet rays for 5 seconds using a 365 nm LED lamp (manufactured by AcroEdge Co., Ltd.) at 40° C. under oxygen-containing air (oxygen concentration: about 20% by volume) (corresponding to the step 3C).

Subsequently, the obtained composition layer was heated at 120° C. for 10 seconds (corresponding to the step 4C). The phase transition temperature of the rod-like liquid crystal compound in the composition (2) for forming an optically anisotropic layer to an isotropic phase was 114° C.

This was followed by nitrogen purging, and then the composition layer was irradiated (irradiation amount: 500 mJ/cm$^2$) with ultraviolet rays using a metal halide lamp (manufactured by Eye Graphics Co., Ltd.) at 120° C. with an oxygen concentration of 100 ppm by volume to form an optically anisotropic layer in which the alignment state of the liquid crystal compound was fixed (corresponding to the step 5C). An optical film (F-2) was prepared in this manner.

| Composition (2) for forming optically anisotropic layer | |
|---|---|
| Rod-like liquid crystal compound (A) given above | 80 parts by mass |
| Rod-like liquid crystal compound (B) given above | 10 parts by mass |
| Polymerizable compound (C) given above | 10 parts by mass |
| Ethylene oxide-modified trimethylolpropane triacrylate (V# 360, manufactured by Osaka Organic Chemical Industry Ltd.) | 4 parts by mass |
| Photopolymerization initiator (Irgacure 819, manufactured by BASF SE) | 3 parts by mass |
| Polymer (A) given above | 0.08 parts by mass |
| Polymer (B) given above | 0.50 parts by mass |
| Methyl isobutyl ketone | 116 parts by mass |
| Ethyl propionate | 40 parts by mass |

Rod-Like Liquid Crystal Compound (B)

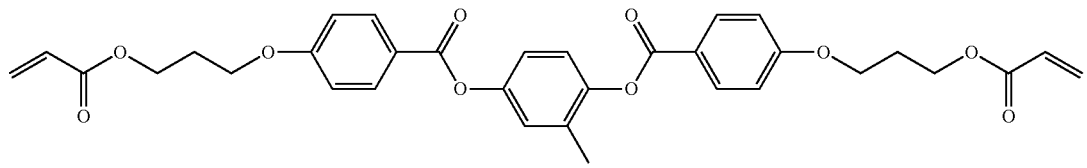 [SMILES: C=CC(=O)OCCCOc1ccc(C(=O)Oc2ccc(OC(=O)c3ccc(OCCCOC(=O)C=C)cc3)c(C)c2)cc1]

Polymerizable Compound (C)

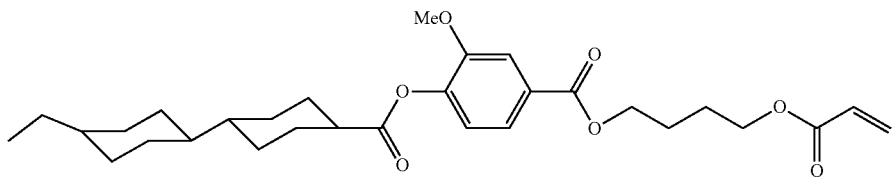 [SMILES: C=CC(=O)OCCCCOC(=O)c1ccc(OC(=O)C2CCC(C3CCC(CC)CC3)CC2)c(OC)c1]

The optical film (F-2) prepared above was cut in parallel with the rubbing direction, and the optically anisotropic layer was observed from the cross-sectional direction with a polarization microscope. The thickness of the optically anisotropic layer was 2.7 µm, the region having a thickness of 1.1 µm on the substrate side of the optically anisotropic layer (first region) had homogeneous alignment of the liquid crystal compound, and the region having a thickness of 1.6 µm on the air side of the optically anisotropic layer (side opposite to the substrate) (second region) had an isotropic state (isotropic phase) of the liquid crystal compound.

The optical properties of the optical film (F-2) were determined using Axoscan of Axometrics, Inc. and analysis software (Multi-Layer Analysis) of Axometrics, Inc. The first region had an in-plane retardation ($\Delta n1d1$) of 140 nm at a wavelength of 550 nm, and an in-plane slow axis of −45°. In addition, the second region had an in-plane retardation ($\Delta n2d2$) of 0 nm at a wavelength of 550 nm and a thickness direction retardation of 0 nm at a wavelength of 550 nm.

The angle of the in-plane slow axis is expressed as negative in a case where it is clockwise (right-handed turning) and positive in a case where it is counterclockwise (left-handed turning) with the longitudinal direction of the film as a reference of 0°, upon observing the substrate from the surface side of the optically anisotropic layer.

Comparative Example 4

The cellulose acylate film prepared in Example 1 was continuously subjected to a rubbing treatment. At this time, the longitudinal direction and the transport direction of the elongated film were parallel to each other, and the angle formed by the longitudinal direction (transport direction) of the film and the rotation axis of the rubbing roller was 45°. The rotation axis of the rubbing roller was 135° in a case where the longitudinal direction (transport direction) of the film was defined as 90°, and the counterclockwise direction was represented by a positive value with reference to the width direction of the cellulose acylate film (0°), upon observing the film from the cellulose acylate film side. In other words, the position of the rotation axis of the rubbing roller was a position rotated by 45° clockwise with reference to the longitudinal direction of the cellulose acylate film.

Using the rubbing-treated cellulose acylate film as a substrate, a composition (C4-1) for forming an optically anisotropic layer containing a rod-like liquid crystal compound having the following composition was applied using a geeser coating machine to form a composition layer.

Next, the obtained composition layer was heated at 80° C. for 60 seconds. This heating resulted in alignment of the rod-like liquid crystal compound of the composition layer in a predetermined direction.

This was followed by nitrogen purging, and then the composition layer was irradiated (irradiation amount: 200 mJ/cm$^2$) with ultraviolet rays using a metal halide lamp (manufactured by Eye Graphics Co., Ltd.) at 80° C. with an oxygen concentration of 100 ppm by volume to form an optically anisotropic layer in which the alignment state of the liquid crystal compound was fixed.

Then, the composition (C4-2) for forming an optically anisotropic layer containing a rod-like liquid crystal compound was applied onto the optically anisotropic layer using a geeser coating machine to form a composition layer.

Next, the obtained composition layer was heated at 120° C. for 60 seconds. The phase transition temperature of the rod-like liquid crystal compound in the composition (C4-2) for forming an optically anisotropic layer to an isotropic phase was 114° C.

This was followed by nitrogen purging, and then the composition layer was irradiated (irradiation amount: 500 mJ/cm$^2$) with ultraviolet rays using a metal halide lamp (manufactured by Eye Graphics Co., Ltd.) at 120° C. with an oxygen concentration of 100 ppm by volume to form an optically anisotropic layer in which the alignment state of the liquid crystal compound was fixed. An optical film (C-4) was prepared in this manner.

The optical film (C-4) prepared above was cut in parallel with the rubbing direction, and the optically anisotropic layer was observed from the cross-sectional direction with a polarization microscope. The thickness of the optically anisotropic layer was 2.7 µm, the region having a thickness of 1.1 µm on the substrate side of the optically anisotropic layer (first region) had homogeneous alignment of the liquid crystal compound, and the region having a thickness of 1.6 µm on the air side of the optically anisotropic layer (side opposite to the substrate) (second region) had an isotropic state (isotropic phase) of the liquid crystal compound.

The optical properties of the optical film (C-4) were determined using Axoscan of Axometrics, Inc. and analysis software (Multi-Layer Analysis) of Axometrics, Inc. The first region had an in-plane retardation ($\Delta n1d1$) of 140 nm at a wavelength of 550 nm, and an in-plane slow axis of −45°. In addition, the second region had an in-plane retardation ($\Delta n2d2$) of 0 nm at a wavelength of 550 nm and a thickness direction retardation of 0 nm at a wavelength of 550 nm.

The angle of the in-plane slow axis is expressed as negative in a case where it is clockwise (right-handed turning) and positive in a case where it is counterclockwise (left-handed turning) with the longitudinal direction of the film as a reference of 0°, upon observing the substrate from the surface side of the optically anisotropic layer.

| Composition (C4-1) for forming optically anisotropic layer | |
| --- | --- |
| Rod-like liquid crystal compound (A) given above | 80 parts by mass |
| Rod-like liquid crystal compound (B) given above | 10 parts by mass |
| Polymerizable compound (C) given above | 10 parts by mass |
| Ethylene oxide-modified trimethylolpropane triacrylate (V# 360, manufactured by Osaka Organic Chemical Industry Ltd.) | 4 parts by mass |
| Photopolymerization initiator (Irgacure 819, manufactured by BASF SE) | 3 parts by mass |
| Polymer (A) given above | 0.0005 parts by mass |
| Polymer (B) given above | 1.23 parts by mass |
| Methyl isobutyl ketone | 116 parts by mass |
| Ethyl propionate | 40 parts by mass |

| Composition (C4-2) for forming optically anisotropic layer | |
| --- | --- |
| Rod-like liquid crystal compound (A) given above | 80 parts by mass |
| Rod-like liquid crystal compound (B) given above | 10 parts by mass |
| Polymerizable compound (C) given above | 10 parts by mass |
| Ethylene oxide-modified trimethylolpropane triacrylate (V# 360, manufactured by Osaka Organic Chemical Industry Ltd.) | 4 parts by mass |
| Photopolymerization initiator (Irgacure 819, manufactured by BASF SE) | 3 parts by mass |
| Polymer (A) given above | 0.14 parts by mass |
| Methyl isobutyl ketone | 116 parts by mass |
| Ethyl propionate | 40 parts by mass |

The above-mentioned analysis by TOF-SIMS and <Evaluation of peelability> were carried out using the obtained optical film. The results are shown in Table 2.

In Example 2, only the secondary ion intensity derived from the leveling agent of 1/1000 or less of the first intensity was observed at any depth of the region between the first position and the second position. In addition, in Comparative Example 4, the maximum value of the secondary ion intensity derived from the leveling agent observed in the region between the first position and the second position was 1/400 of the first intensity.

TABLE 2

| | Optical film | Secondary ion intensity | Peelability |
| --- | --- | --- | --- |
| Example 2 | F-2 | A | A |
| Comparative Example 4 | C-4 | B | B |

As shown in the above table, the desired effect was obtained in the optically anisotropic layer according to the embodiment of the present invention.

On the other hand, in Comparative Examples, the peeling of the squares occurred, and as a result of observing the peeling position of the peeled square with an optical microscope in cross section, the peeling occurred inside the optically anisotropic layer.

Example 3

(Formation of Optically Anisotropic Layer)

The cellulose acylate film prepared in Example 1 was continuously subjected to a rubbing treatment. At this time, the longitudinal direction and the transport direction of the elongated film were parallel, and the angle between the film longitudinal direction (transport direction) and the rubbing roller rotation axis was 90°.

Using the rubbing-treated cellulose acylate film as a substrate, a composition (3) for forming an optically anisotropic layer containing a rod-like liquid crystal compound having the following composition was applied using a geeser coating machine to form a composition layer (corresponding to the step 1A). The absolute value of the weighted average helical twisting power of the chiral agent in the composition layer in the step 1A was 31 $\mu m^{-1}$.

Next, the obtained composition layer was heated at 100° C. for 80 seconds (corresponding to the step 2A). This heating resulted in alignment of the rod-like liquid crystal compound of the composition layer in a predetermined direction.

Then, the composition layer was irradiated (irradiation amount: 100 mJ/cm$^2$) with ultraviolet rays for 10 seconds using a 365 nm LED lamp (manufactured by AcroEdge Co., Ltd.) at 40° C. under oxygen-containing air (corresponding to the step 3A).

Subsequently, the obtained composition layer was heated at 90° C. for 10 seconds (corresponding to the step 4A).

This was followed by nitrogen purging, and then the composition layer was irradiated (irradiation amount: 500 mJ/cm$^2$) with ultraviolet rays using a metal halide lamp (manufactured by Eye Graphics Co., Ltd.) at 55° C. with an oxygen concentration of 100 ppm by volume to form an optically anisotropic layer in which the alignment state of the liquid crystal compound was fixed (corresponding to the step 5A). An optical film (F-3) was prepared in this manner.

| Composition (3) for forming optically anisotropic layer | |
| --- | --- |
| Rod-like liquid crystal compound (A) given above | 80 parts by mass |
| Rod-like liquid crystal compound (B) given above | 10 parts by mass |
| Rod-like liquid crystal compound (C) given above | 10 parts by mass |
| Ethylene oxide-modified trimethylolpropane triacrylate (V# 360, manufactured by Osaka Organic Chemical Industry Ltd.) | 4 parts by mass |
| Photopolymerization initiator (Irgacure 819, manufactured by BASF SE) | 3 parts by mass |
| Right-handed twisting chiral agent (R1) given below | 11 parts by mass |
| Polymer (A) given above | 0.08 parts by mass |
| Polymer (B) given above | 0.5 parts by mass |
| Methyl isobutyl ketone | 117 parts by mass |
| Ethyl propionate | 39 parts by mass |

Right-Handed Twisting Chiral Agent (R1)

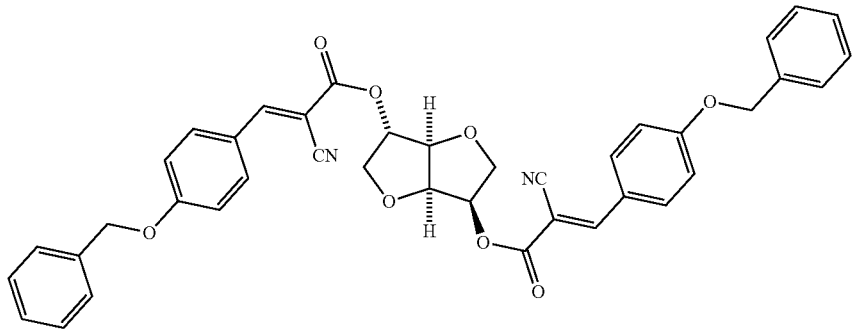 [SMILES: N#C/C(=C\c1ccc(OCc2ccccc2)cc1)C(=O)O[C@H]1CO[C@H]2[C@@H]1OC[C@H]2OC(=O)/C(C#N)=C/c1ccc(OCc2ccccc2)cc1]

The optical film (F-3) prepared above was cut in parallel with the rubbing direction, and the optically anisotropic layer was observed from the cross-sectional direction with SEM. The optically anisotropic layer had a thickness of 3.6 μm and had the region having a thickness of 1.8 μm on the substrate side of the optically anisotropic layer (second region) and the region having a thickness of 1.8 μm on the air side of the optically anisotropic layer (side opposite to the substrate) (first region), and the second region and the first region had cholesteric alignments having different helical pitches.

The spectral reflection properties of the optical film (F-3) were determined using an integrated reflectometer. It was confirmed that the optical film (F-3) was a two-band cholesteric liquid crystal film having a reflection band centered at 450 nm derived from the second region and a reflection band centered at 650 nm derived from the first region.

Comparative Example 5

The cellulose acylate film prepared in Example 1 was continuously subjected to a rubbing treatment. At this time, the longitudinal direction and the transport direction of the elongated film were parallel, and the angle between the film longitudinal direction (transport direction) and the rubbing roller rotation axis was 90°.

Using the rubbing-treated cellulose acylate film as a substrate, a composition (C5-1) for forming an optically anisotropic layer containing a rod-like liquid crystal compound having the following composition was applied using a geeser coating machine to form a composition layer.

Next, the obtained composition layer was heated at 100° C. for 80 seconds. This heating resulted in alignment of the rod-like liquid crystal compound of the composition layer in a predetermined direction.

This was followed by nitrogen purging, and then the composition layer was irradiated (irradiation amount: 200 mJ/cm$^2$) with ultraviolet rays using a metal halide lamp (manufactured by Eye Graphics Co., Ltd.) at 80° C. with an oxygen concentration of 100 ppm by volume to form an optically anisotropic layer in which the alignment state of the liquid crystal compound was fixed.

Then, the composition (C5-2) for forming an optically anisotropic layer containing a rod-like liquid crystal compound was applied onto the optically anisotropic layer using a geeser coating machine to form a composition layer.

Next, the obtained composition layer was heated at 80° C. for 60 seconds. This heating resulted in alignment of the rod-like liquid crystal compound of the composition layer in a predetermined direction.

This was followed by nitrogen purging, and then the composition layer was irradiated (irradiation amount: 500 mJ/cm$^2$) with ultraviolet rays using a metal halide lamp (manufactured by Eye Graphics Co., Ltd.) at 55° C. with an oxygen concentration of 100 ppm by volume to form an optically anisotropic layer in which the alignment state of the liquid crystal compound was fixed. An optical film (C-5) was prepared in this manner.

The optical film (C-5) prepared above was cut in parallel with the rubbing direction, and the optically anisotropic layer was observed from the cross-sectional direction with SEM. The optically anisotropic layer had a thickness of 3.6 μm and had the region having a thickness of 1.8 μm on the substrate side of the optically anisotropic layer (second region) and the region having a thickness of 1.8 μm on the air side of the optically anisotropic layer (side opposite to the substrate) (first region), and the second region and the first region had cholesteric alignments having different helical pitches.

The spectral reflection properties of the optical film (C-5) were determined using an integrated reflectometer. It was confirmed that the optical film (C-5) was a two-band cholesteric liquid crystal film having a reflection band centered at 450 nm derived from the second region and a reflection band centered at 650 nm derived from the first region.

| Composition (C5-1) for forming optically anisotropic layer | |
|---|---|
| Rod-like liquid crystal compound (A) given above | 80 parts by mass |
| Rod-like liquid crystal compound (B) given above | 10 parts by mass |
| Rod-like liquid crystal compound (C) given above | 10 parts by mass |
| Ethylene oxide-modified trimethylolpropane triacrylate (V# 360, manufactured by Osaka Organic Chemical Industry Ltd.) | 4 parts by mass |
| Photopolymerization initiator (Irgacure 819, manufactured by BASF SE) | 3 parts by mass |
| Right-handed twisting chiral agent (R1) given above | 11 parts by mass |
| Polymer (A) given above | 0.0004 parts by mass |
| Polymer (B) given above | 1.0 part by mass |
| Methyl isobutyl ketone | 117 parts by mass |
| Ethyl propionate | 39 parts by mass |

| Composition (C5-2) for forming optically anisotropic layer | |
|---|---|
| Rod-like liquid crystal compound (A) given above | 80 parts by mass |
| Rod-like liquid crystal compound (B) given above | 10 parts by mass |
| Rod-like liquid crystal compound (C) given above | 10 parts by mass |
| Ethylene oxide-modified trimethylolpropane triacrylate (V# 360, manufactured by Osaka Organic Chemical Industry Ltd.) | 4 parts by mass |
| Photopolymerization initiator (Irgacure 819, manufactured by BASF SE) | 3 parts by mass |
| Right-handed twisting chiral agent (R1) given above | 4 parts by mass |
| Polymer (A) given above | 0.16 parts by mass |
| Methyl isobutyl ketone | 117 parts by mass |
| Ethyl propionate | 39 parts by mass |

The above-mentioned analysis by TOF-SIMS and <Evaluation of peelability> were carried out using the obtained optical film. The results are shown in Table 3.

In Example 3, only the secondary ion intensity derived from the leveling agent of 1/1000 or less of the first intensity was observed at any depth of the region between the first position and the second position. In addition, in Comparative Example 5, the maximum value of the secondary ion intensity derived from the leveling agent observed in the region between the first position and the second position was 1/400 of the first intensity.

TABLE 3

| | Optical film | Secondary ion intensity | Peelability |
|---|---|---|---|
| Example 3 | F-3 | A | A |
| Comparative Example 5 | C-5 | B | B |

As shown in the above table, the desired effect was obtained in the optically anisotropic layer according to the embodiment of the present invention.

On the other hand, in Comparative Examples, the peeling of the squares occurred, and as a result of observing the peeling position of the peeled square with an optical microscope in cross section, the peeling occurred inside the optically anisotropic layer.

Example 4

(Formation of Optically Anisotropic Layer)

The alignment film prepared in Example 1 was continuously subjected to a rubbing treatment. At this time, the longitudinal direction and the transport direction of the elongated film were parallel, and the angle between the film longitudinal direction (transport direction) and the rubbing roller rotation axis was 90°.

Using the rubbing-treated cellulose acylate film with an alignment film as a substrate, a composition (4) for forming an optically anisotropic layer containing a rod-like liquid crystal compound having the following composition was applied using a geeser coating machine to form a composition layer (corresponding to the step 1B).

Next, the obtained composition layer was heated at 120° C. for 80 seconds (corresponding to the step 2B). This heating resulted in alignment of the rod-like liquid crystal compound of the composition layer in a predetermined direction.

Then, the composition layer was irradiated (irradiation amount: 30 mJ/cm$^2$) with ultraviolet rays for 5 seconds using a 365 nm LED lamp (manufactured by AcroEdge Co., Ltd.) at 40° C. under oxygen-containing air (oxygen concentration: about 20% by volume) (corresponding to the step 3B).

Subsequently, the obtained composition layer was heated at 90° C. for 10 seconds (corresponding to the step 4B).

This was followed by nitrogen purging, and then the composition layer was irradiated (irradiation amount: 500 mJ/cm$^2$) with ultraviolet rays using a metal halide lamp (manufactured by Eye Graphics Co., Ltd.) at 55° C. with an oxygen concentration of 100 ppm by volume to form an optically anisotropic layer in which the alignment state of the liquid crystal compound was fixed (corresponding to the step 5B). An optical film (F-4) was prepared in this manner.

| Composition (4) for forming optically anisotropic layer | |
|---|---|
| Rod-like liquid crystal compound (F) given below | 42 parts by mass |
| Rod-like liquid crystal compound (G) given below | 42 parts by mass |
| Rod-like liquid crystal compound (H) given below | 12 parts by mass |
| Rod-like liquid crystal compound (I) given below | 4 parts by mass |
| NK ESTER A-200 (manufactured by Shin-Nakamura Chemical Co., Ltd.) | 1 part by mass |
| HISOLVE MTEM (manufactured by Toho Chemical Industry Co., Ltd.) | 2 parts by mass |
| Photopolymerization initiator (Irgacure 819, manufactured by BASF SE) | 3 parts by mass |
| Polymer (A) given above | 0.08 parts by mass |
| Polymer (B) given above | 0.5 parts by mass |
| Photosensitive compound (A) given above | 0.4 parts by mass |
| Ionic compound (A) given above | 3.0 parts by mass |
| Methyl ethyl ketone | 156 parts by mass |

Rod-Like Liquid Crystal Compound (F)

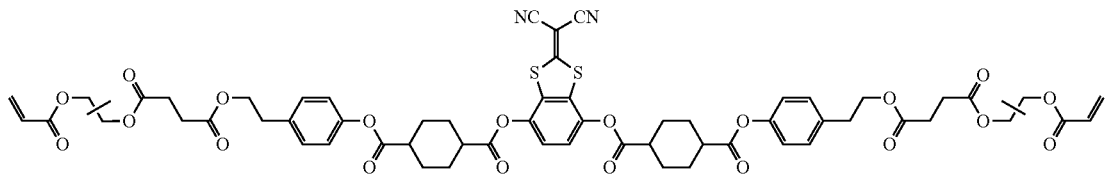

Rod-Like Liquid Crystal Compound (G)

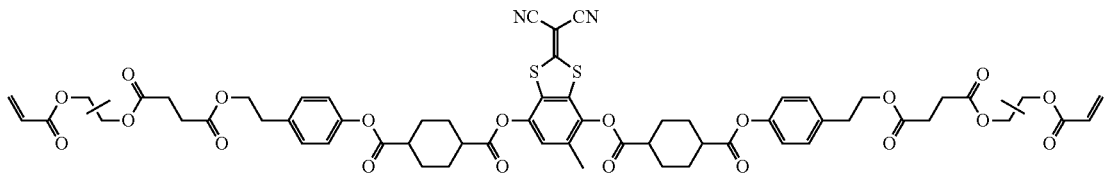

Rod-Like Liquid Crystal Compound (H)

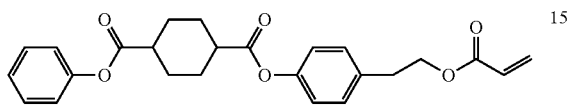

Rod-Like Liquid Crystal Compound (I)

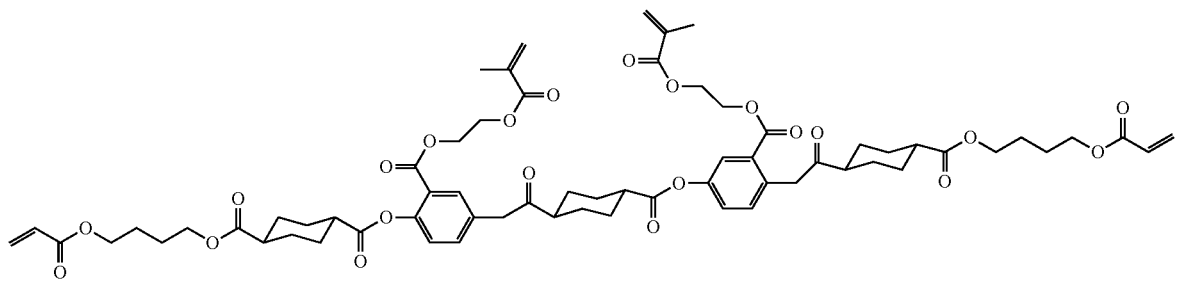 [SMILES: C=CC(=O)OCCCCOC(=O)C1CCC(C(=O)Cc2ccc(OC(=O)C3CCC(C(=O)Cc4ccc(OC(=O)C5CCC(C(=O)OCCCCOC(=O)C=C)CC5)c(C(=O)OCCOC(=O)C(=C)C)c4)CC3)cc2C(=O)OCCOC(=O)C(=C)C)CC1]

The optical film (F-4) prepared above was cut in parallel with the rubbing direction, and the optically anisotropic layer was observed from the cross-sectional direction with a polarization microscope. The thickness of the optically anisotropic layer was 4.3 μm, the region having a thickness of 2.4 μm on the substrate side of the optically anisotropic layer (first region) had homogeneous alignment of the liquid crystal compound, and the region having a thickness of 1.9 μm on the air side of the optically anisotropic layer (side opposite to the substrate) (second region) had homeotropic alignment of the liquid crystal compound.

The optical properties of the optical film (F-4) were determined using Axoscan of Axometrics, Inc. and analysis software (Multi-Layer Analysis) of Axometrics, Inc. The first region had an in-plane retardation ($\Delta n1d1$) of 130 nm at a wavelength of 550 nm, and an angle of an in-plane slow axis of 0° with respect to the longitudinal direction of the film. In addition, the second region had an in-plane retardation ($\Delta n2d2$) of 0 nm at a wavelength of 550 nm and a thickness direction retardation of −100 nm at a wavelength of 550 nm.

The angle of the in-plane slow axis is 0° with reference to the longitudinal direction of the film.

The above-mentioned analysis by TOF-SIMS and <Evaluation of peelability> were carried out using the obtained optical film. The results are shown in Table 4.

In Example 4, only the secondary ion intensity derived from the leveling agent of 1/1000 or less of the first intensity was observed at any depth of the region between the first position and the second position.

TABLE 4

| | Optical film | Secondary ion intensity | Peelability |
|---|---|---|---|
| Example 4 | F-4 | A | A |

As shown in the above table, the desired effect was obtained in the optically anisotropic layer according to the embodiment of the present invention.

EXPLANATION OF REFERENCES

10: substrate
12, 120, 220, 320: optically anisotropic layer
122, 222, 322: composition layer
122A, 222A, 322A: lower region
122B, 222B, 322B: upper region
22: another optically anisotropic layer
24: laminate
26: polarizer
28: optically anisotropic layer with a polarizer

What is claimed is:
1. An optically anisotropic layer formed of a liquid crystal compound,
wherein the optically anisotropic layer contains a leveling agent,
in a case where components of the optically anisotropic layer in a depth direction are analyzed by time-of-flight secondary ion mass spectrometry while irradiating the optically anisotropic layer with an ion beam from one surface of the optically anisotropic layer to the other surface of the optically anisotropic layer, a profile of a secondary ion intensity derived from the leveling agent in a depth direction is obtained, a higher secondary ion intensity derived from the leveling agent, out of a secondary ion intensity derived from the leveling agent on the one surface of the optically anisotropic layer and a secondary ion intensity derived from the leveling agent on the other surface of the optically anisotropic layer, is defined as a first intensity, a secondary ion intensity which is 1/1000 of the first intensity is defined as a second intensity, a depth position closest to the one surface showing the second intensity in the profile is defined as a first position, and a depth position closest to the other surface showing the second intensity in the profile is defined as a second position, no secondary ion intensity derived from the leveling agent of 1/500 or more of the first intensity is observed at any depth of a region between the first position and the second position, and the optically anisotropic layer satisfies any of the following Requirements 1 to 3, Requirement 1: the optically anisotropic layer is an optically anisotropic layer formed by fixing a cholesteric liquid crystalline phase, and has a plurality of regions in which helical pitches of the cholesteric liquid crystalline phase are different along a thickness direction, Requirement 2: the optically anisotropic layer is an optically anisotropic layer formed by fixing an alignment state of a liquid crystal compound, and has a plurality of regions in which tilt angles of an alignment direction of the liquid crystal compound with respect to a surface of the optically anisotropic layer are different along a thickness direction, Requirement 3: the optically anisotropic layer has a region formed by fixing an alignment state in which the liquid crystal compound is aligned and a region formed by fixing a state in which the liquid crystal compound exhibits an isotropic phase, along a thickness direction.

2. The optically anisotropic layer according to claim 1, wherein the optically anisotropic layer satisfies Requirement 1.

3. The optically anisotropic layer according to claim 2, wherein the optically anisotropic layer has two regions in which the helical pitches of the cholesteric liquid crystalline phase are different.

4. The optically anisotropic layer according to claim 1, wherein the optically anisotropic layer satisfies Requirement 2.

5. The optically anisotropic layer according to claim 4, wherein the optically anisotropic layer has a region formed by fixing an alignment state of the liquid crystal compound homogeneously aligned and a region formed by fixing an alignment state of the liquid crystal compound homeotropically aligned.

6. The optically anisotropic layer according to claim 1, wherein the optically anisotropic layer satisfies Requirement 3.

7. The optically anisotropic layer according to claim 6, wherein the optically anisotropic layer has a region formed by fixing an alignment state of the liquid crystal compound homogeneously aligned and a region formed by fixing a state in which the liquid crystal compound exhibits an isotropic phase.

* * * * *